(12) United States Patent
Matsuura

(10) Patent No.: US 8,378,870 B1
(45) Date of Patent: Feb. 19, 2013

(54) MISMATCH SHAPING FOR DAC

(75) Inventor: Toru Matsuura, Kanagawa (JP)

(73) Assignee: Panasonic Corporation, Osaka (JP)

( * ) Notice: Subject to any disclaimer, the term of this patent is extended or adjusted under 35 U.S.C. 154(b) by 36 days.

(21) Appl. No.: 13/227,268

(22) Filed: Sep. 7, 2011

(51) Int. Cl.
*H03M 1/66* (2006.01)
(52) U.S. Cl. ........................................ 341/144; 341/145
(58) Field of Classification Search .................. 341/144, 341/145, 135, 136, 138, 139, 118, 119, 120; 327/350
See application file for complete search history.

(56) References Cited

U.S. PATENT DOCUMENTS 6,424,281 B1 * 7/2002 Liaw et al. .................... 341/144

OTHER PUBLICATIONS

Shui, Tao et al. "Mismatch Shaping for a Current-Mode Multibit Delta-Sigma DAC", IEEE Journal of Solid-State Circuits, vol. 34, No. 3, Mar. 1999, pp. 331-338.

* cited by examiner

*Primary Examiner* — Joseph Lauture

(57) ABSTRACT

The present invention provides a DAC (Digital to Analog Converter) capable of generating a transfer function having a notch for reducing an error signal level in a desired frequency band.

The DAC of the present invention includes a switch bank to which at least two reference signals are inputted and which selects any of these signals and outputs the selected signal through a plurality of paths, and an amplitude-phase control section which controls a reference signal selection operation of the switch bank on the basis of an input signal.

16 Claims, 27 Drawing Sheets

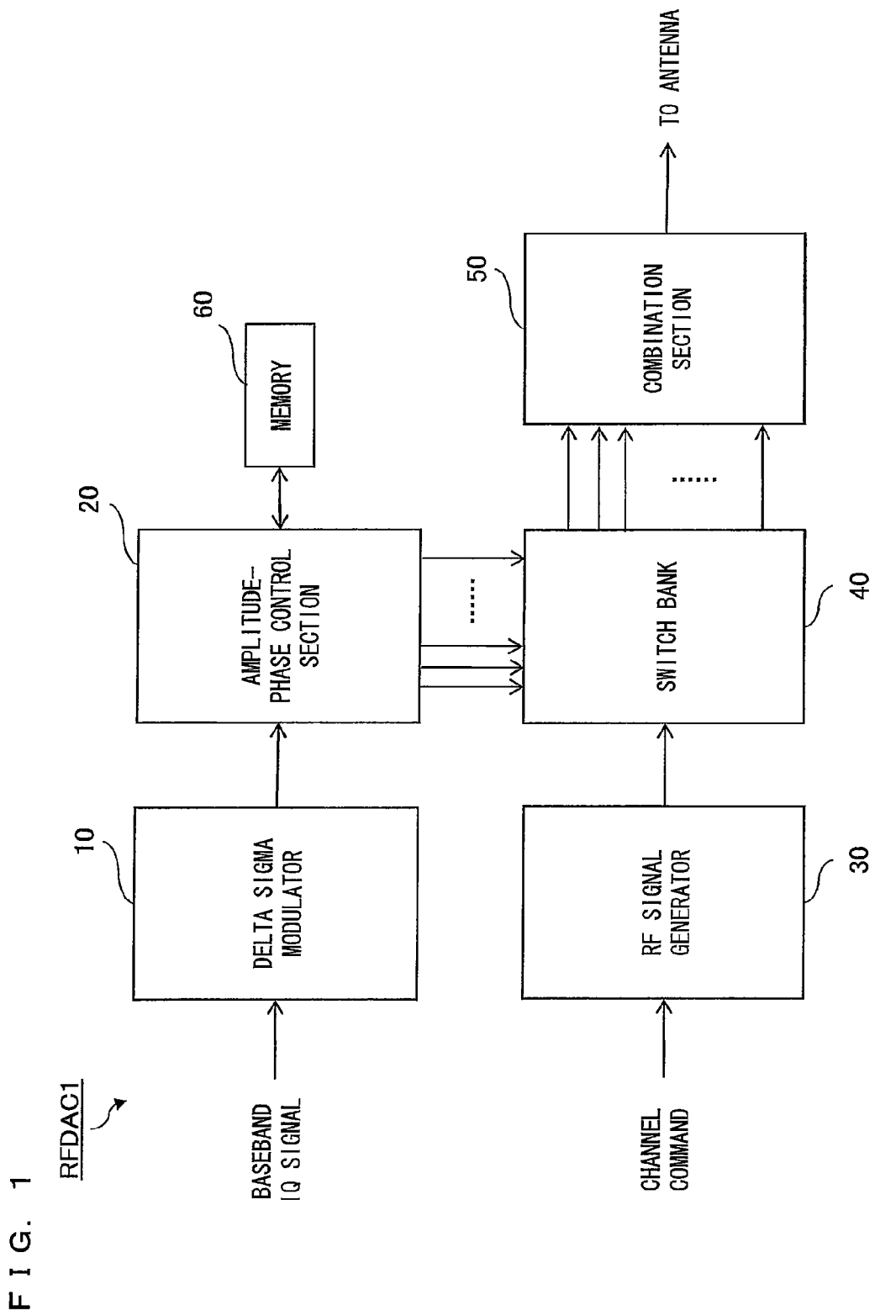
F I G. 1

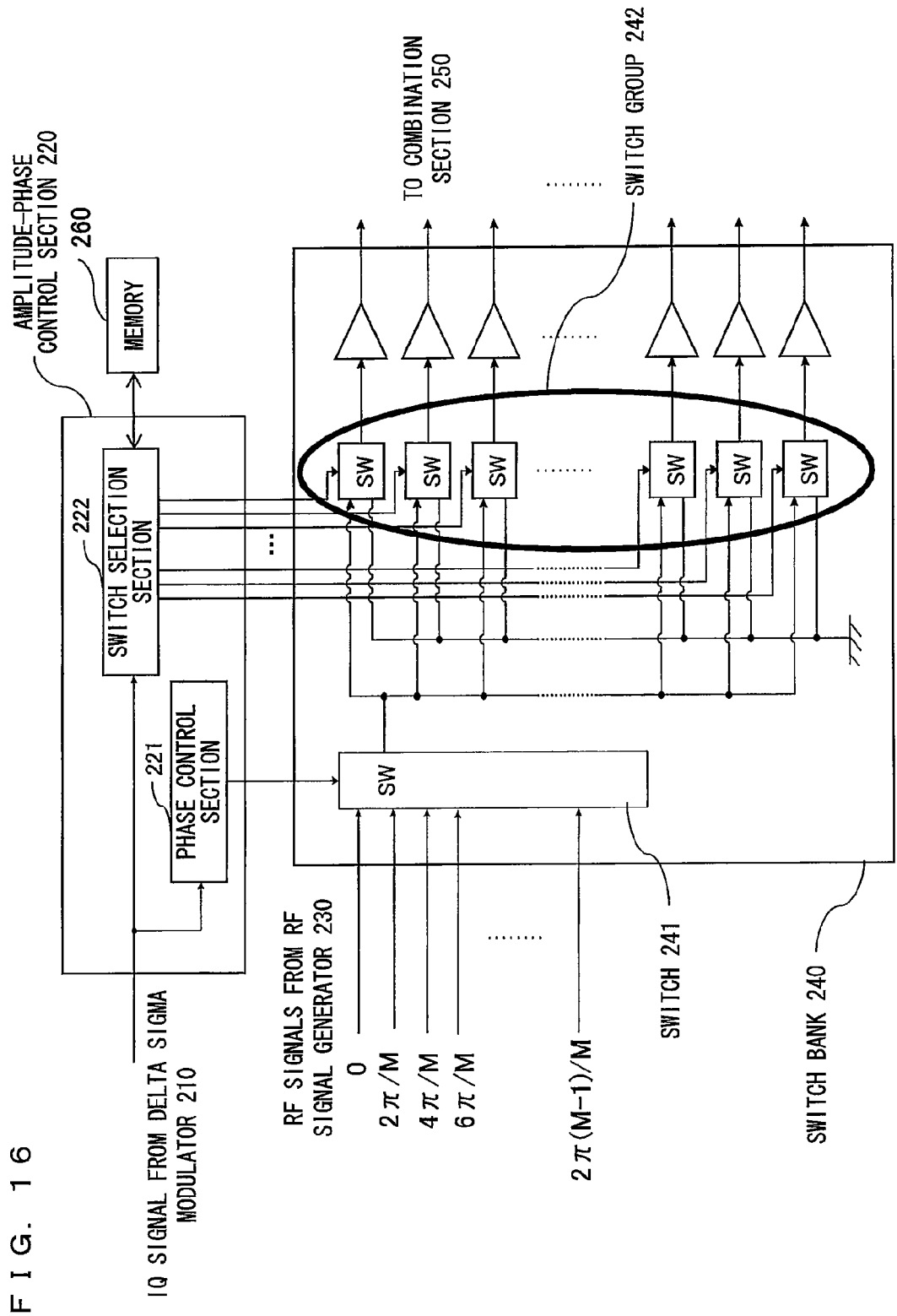
F I G. 16

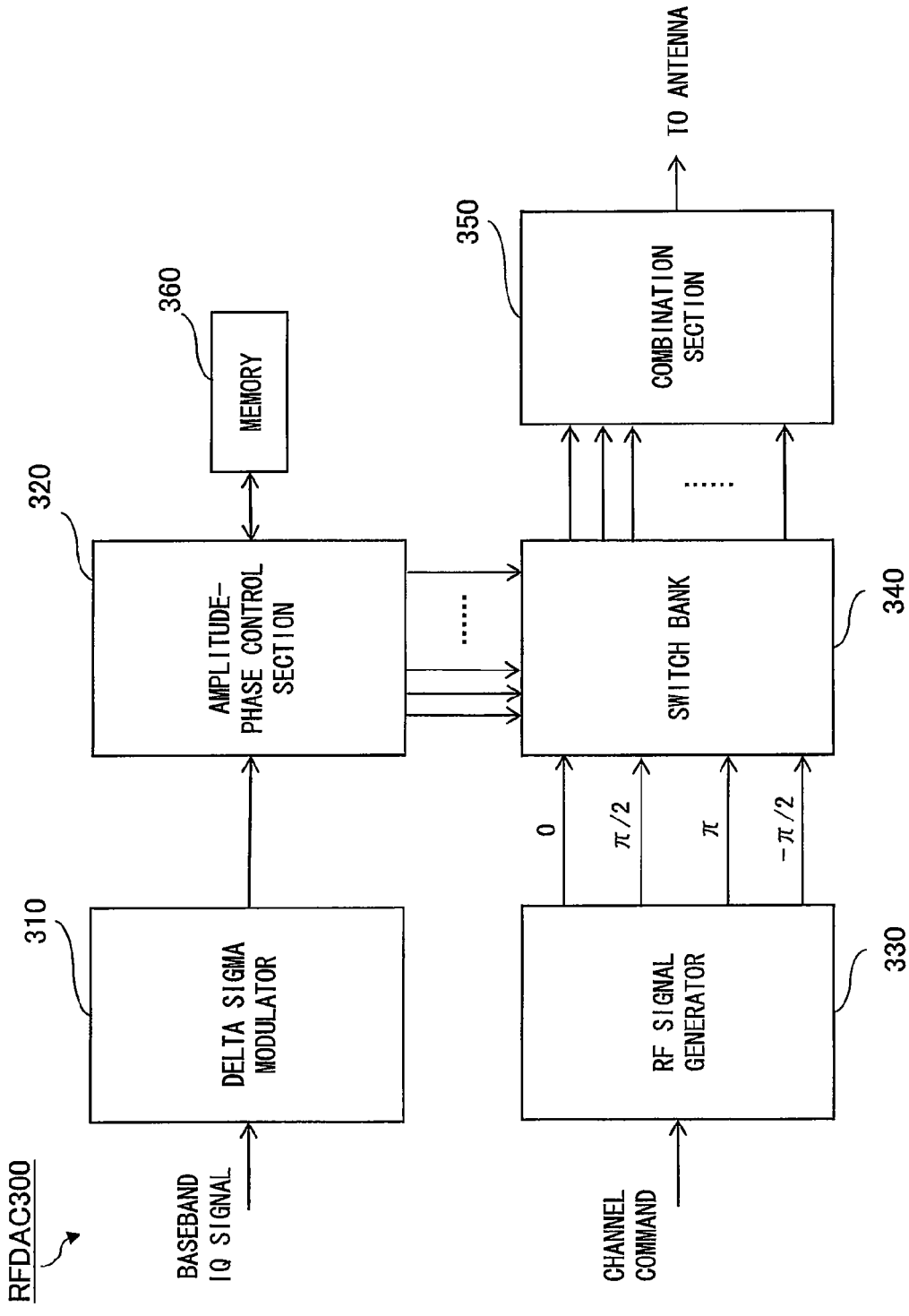

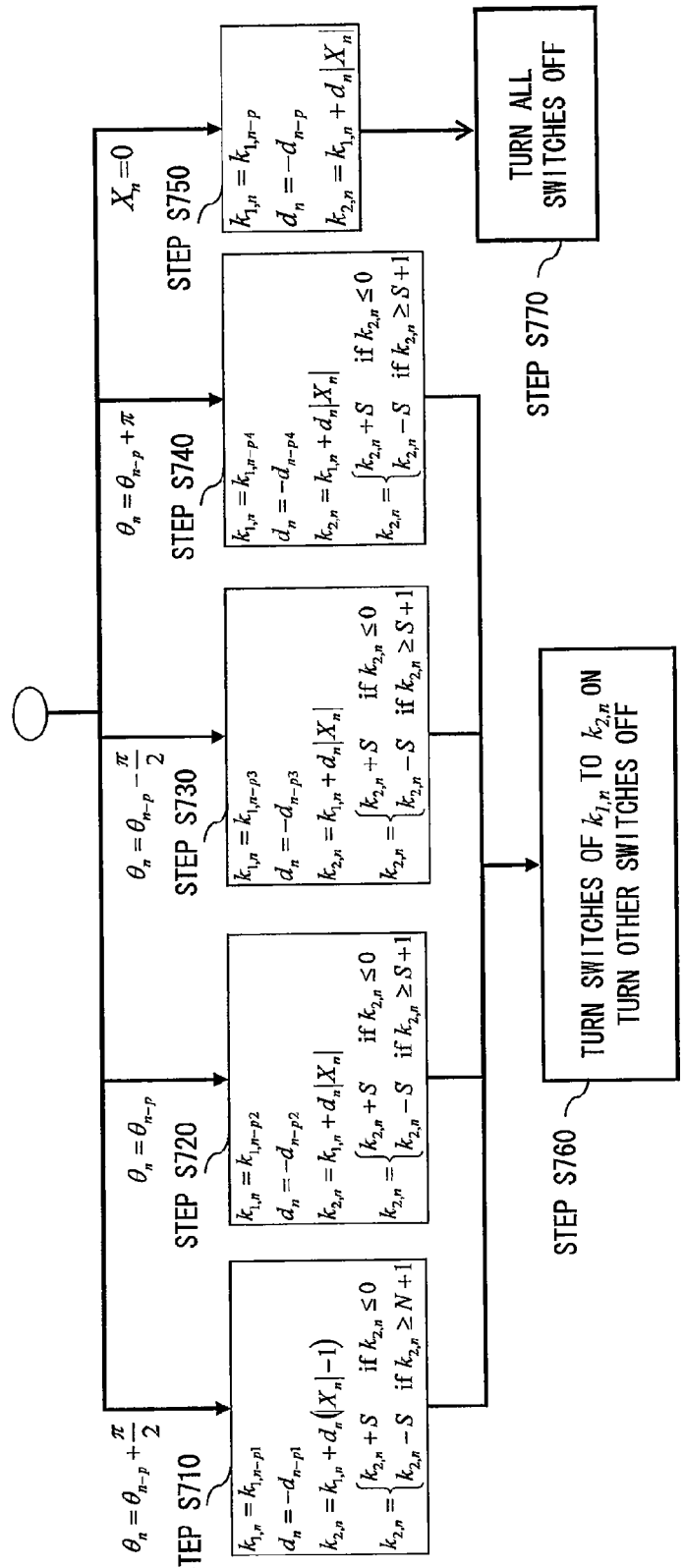

F I G. 2 1
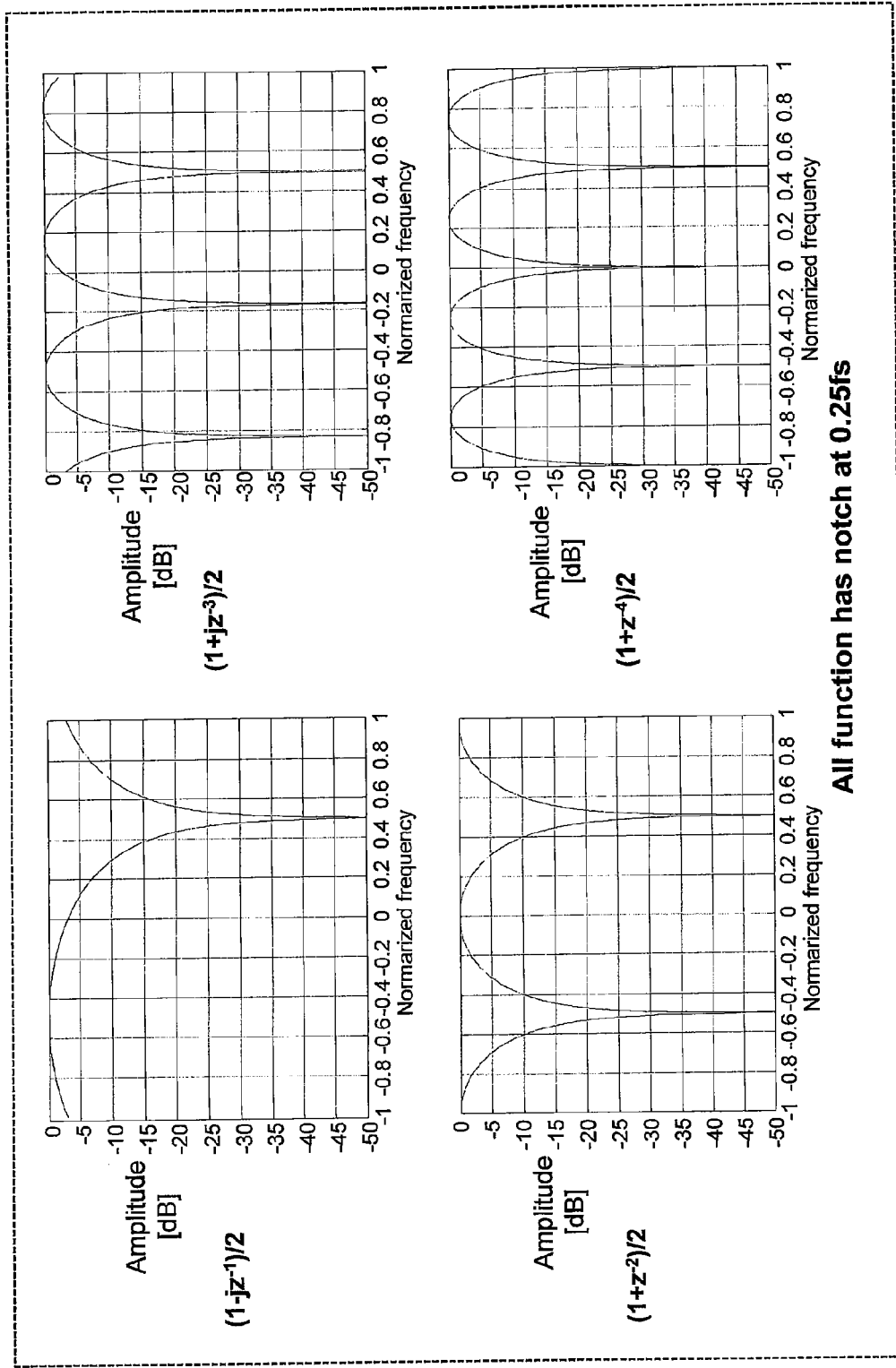

RFDAC400

FIG. 22C

| zone | Condition | +axis Number | +axis Phase (θ1) | X axis Number | X axis Phase (θ2) |
|---|---|---|---|---|---|
| #1 | I≥0, Q≥0, I>Q | I-Q | 0 | Q | 45 |
| #2 | I>0, Q>0, I≤Q | Q-I | 90 | I | 45 |
| #3 | I≤0, Q>0, \|I\|<Q | Q-\|I\| | 90 | \|I\| | 135 |
| #4 | I<0, Q>0, \|I\|≥Q | \|I\|-Q | 180 | Q | 135 |
| #5 | I<0, Q≤0, \|I\|>\|Q\| | \|I\|-\|Q\| | 180 | \|Q\| | -135 |
| #6 | I<0, Q<0, \|I\|≤\|Q\| | \|Q\|-\|I\| | -90 | \|I\| | -135 |
| #7 | I≥0, Q<0, I<\|Q\| | \|Q\|-I | -90 | I | -45 |
| #8 | I>0, Q<0, I≥\|Q\| | I-\|Q\| | 0 | \|Q\| | -45 |

MISMATCH SHAPING FOR DAC

BACKGROUND OF THE INVENTION

1. Field of the Invention

The present invention relates to a DAC (Digital to Analog Converter) for converting a digital signal into an analog signal, and more particularly, relates to a DAC for generating a transfer function having a desired notch while reducing quantization noise.

2. Description of the Background Art

In a conventional DAC, particularly, for example, in an RF DAC (Radio Frequency Digital to Analog Converter) used to be applied to a radio transmitter, quantization noise is removed by using a noise shaping technology with a delta sigma modulator, and a transfer function having a notch for reducing a signal level in a desired frequency band is generated.

For example, in Non-Patent Literature 1 ("Mismatch Shaping for a Current-Mode Multibit Delta-Sigma DAC", T. Shui et al, IEEE JOURNAL OF SOLID-STATE CIRCUITS, VOL. 34, NO. 3, MARCH 1999), a transfer function having a notch for reducing a signal level in a desired frequency band is generated by using a mismatch shaping technology.

However, Non-Patent Literature 1 discloses an algorithm for controlling a unit-element array on the basis of input information (amplitude information, scalar) that is information two items before in a temporal axis, as shown in FIG. 24.

In the algorithm of the conventional mismatch shaping, when a phase error occurs, a transfer function having a notch for reducing an error signal level in a desired frequency band cannot be obtained, and thus noise characteristics deteriorate.

SUMMARY OF THE INVENTION

Therefore, an object of the present invention is to provide a DAC for executing an algorithm for controlling a unit-element array, in order to generate a transfer function having a notch for reducing an error signal level in a desired frequency band in consideration of a gain error and a phase error.

In order to achieve the object described above, the present invention is a DAC for converting a digital signal that is an input signal, into an analog signal. The DAC includes: a switch bank to which at least two reference signals are inputted, which includes a plurality of switches for selecting any of the reference signals, and which outputs the selected reference signal through a plurality of paths; a memory in which a history of previously selected switches among the plurality of switches and previous sample values of the input signal are stored; and an amplitude-phase control section to which the input signal is inputted and which controls the switches of the switch bank on the basis of the input signal. The amplitude-phase control section refers to the memory and controls the switches of the switch bank in accordance with the history of the previously selected switches and a change of a current sample value of the input signal from a sample value that is a predetermined time ago, in order to select any of the at least two reference signals.

Further, in order to achieve the object mentioned above, a process performed by each component of the above-described DAC of the present invention can be regarded as a mismatch shaping method providing a series of process steps. The method is provided in a form of a program for causing a computer to execute the series of process steps. The program may be recorded in a computer-readable recording medium to be introduced to the computer.

As described above, according to the DAC of the present invention, an algorithm for controlling a unit-element array is executed in consideration of a gain error and a phase error. Thus, a transfer function having a notch for reducing an error signal level in a desired frequency band can be generated.

The present invention is useful for a transmitter for transmitting RF signals, a transmitting/receiving apparatus for transmitting and receiving RF signals, and the like.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram illustrating an outline of an RF DAC 1 according to the present invention;

FIG. 16 is a diagram illustrating details of an amplitude-phase control section 220 and a switch bank 240;

FIG. 18A is a block diagram illustrating an outline of an RF DAC 300 according to a second embodiment of the present invention;

FIG. 20 is a diagram illustrating an algorithm used by a switch selection section 322 of the amplitude-phase control section 320;

FIG. 21 is a diagram illustrating transfer functions in the case where p1=1, p2=2, p3=3, p4=4, and p=1;

FIG. 22C is a diagram illustrating signal conversion in the RF DAC 400;

DESCRIPTION OF THE PREFERRED EMBODIMENTS

Basic Configuration

Figure 2:
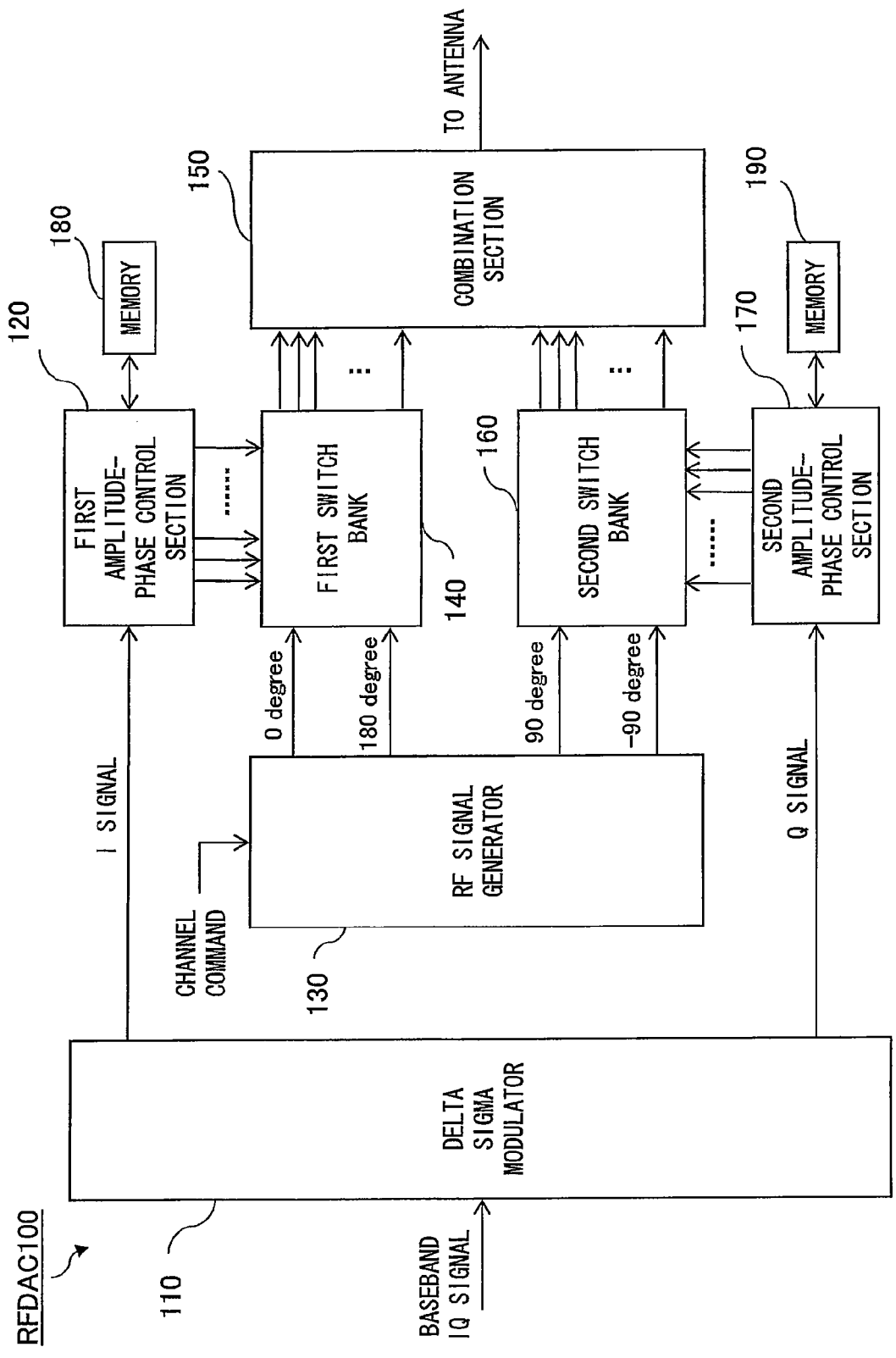
FIG. 2 is a block diagram illustrating an outline of an RF DAC 100 according to a first embodiment of the present invention.

FIG. 1 is a block diagram illustrating an outline of an RF DAC 1 that is a preferred application example of a DAC according to the present invention. The RF DAC 1 includes a delta sigma modulator 10, an amplitude-phase control section 20, an RF signal generator 30, a switch bank 40, a combination section 50, and a memory 60.

The delta sigma modulator 10 quantizes an inputted baseband IQ signal, performs noise shaping, and then outputs an I signal (in-phase signal) and a Q signal (quadrature-phase signal). When quantization noise of the baseband IQ signal is sufficiently low, the delta sigma modulator 10 may not be provided.

The amplitude-phase control section 20 refers to the memory 60 described below, and controls RF signals generated by the RF signal generator 30 described below, on the basis of the I signal and the Q signal outputted from the delta sigma modulator 10.

A channel command used for determining the frequency of an RF signal is inputted to the RF signal generator 30, and the RF signal generator 30 generates RF signals of at least four phases. When a system does not have to control a frequency, it is also unnecessary to control a frequency by the channel command.

The switch bank 40 is composed of a plurality of switches and further includes power amplifiers for amplifying inputted RF signals. The plurality of switches are controlled by the amplitude-phase control section 20, and RF signals are outputted through a plurality of paths in accordance with a desired phase and amplitude. In the memory 60, a history of previously selected switches among the plurality of switches constituting the switch bank 40, and a history of the values of previously inputted IQ signals, are stored. The amplitude-phase control section 20 updates the histories stored in the memory 60.

The combination section 50 combines the RF signals inputted through the plurality of paths in the switch bank 40. Then, an RF signal resulting from the combination is transmitted through an antenna.

Hereinafter, each embodiment of the present invention will be described with reference to the drawings.

First Embodiment

FIG. 2 is a block diagram illustrating an outline of an RF DAC 100 according to a first embodiment of the present invention. In FIG. 2, the RF DAC 100 includes a delta sigma modulator 110, a first amplitude-phase control section 120, an RF signal generator 130, a first switch bank 140, a combination section 150, a second switch bank 160, a second amplitude-phase control section 170, a first memory 180, and a second memory 190.

Here, the correspondence relation between the RF DAC 100 shown in FIG. 2 and the RF DAC 1 shown in FIG. 1 will be described. The delta sigma modulator 110, the RF signal generator 130, and the combination section 150 in FIG. 2 correspond to the delta sigma modulator 10, the RF signal generator 30, and the combination section 150, respectively, in FIG. 1. The first amplitude-phase control section 120 and the second amplitude-phase control section 170 in FIG. 2 correspond to the amplitude-phase control section 20 in FIG. 2. In addition, the first switch bank 140 and the second switch bank 160 in FIG. 2 correspond to the switch bank 40 in FIG. 1. Moreover, the first memory 180 and the second memory 190 in FIG. 2 correspond to the memory 60 in FIG. 1.

In FIG. 2, a baseband IQ signal is inputted to the delta sigma modulator 110. The delta sigma modulator 110 quantizes the baseband IQ signal, performs noise shaping, and then outputs an I signal (in-phase signal) and a Q signal (quadrature-phase signal). When the baseband IQ signal inputted to the RF DAC 100 has a sufficient bit width, the delta sigma modulator 110 may be omitted.

The first amplitude-phase control section 120 refers to the first memory 180 described below, and controls RF signals generated by the RF signal generator 130 described below, on the basis of the I signal outputted from the delta sigma modulator 110.

Meanwhile, the second amplitude-phase control section 170 refers to the second memory 190 described below, and controls RF signals generated by the RF signal generator 130, on the basis of the Q signal outputted from the delta sigma modulator 110.

A channel command is inputted to the RF signal generator 130, and the RF signal generator 130 generates RF signals of at least four phases. As a specific example, the RF signal generator 130 generates RF signals of four phases (0, $\pi$, $\pi/2$, $-\pi/2$[radian]), outputs the RF signals of the phases 0 and $\pi$ to the first switch bank 140, and outputs the RF signals of the phases $\pi/2$ and $-\pi/2$ to the second switch bank 160. In addition, in the case of eight phases, for example, the phases are 0, $\pi/4$, $\pi/2$, $3\pi/4$, $\pi$, $-\pi/4$, $-\pi/2$, and $-3\pi/4$ [radian].

The first switch bank 140 is composed of a plurality of switches and further includes power amplifiers for amplifying inputted RF signals. Then, the plurality of switches are controlled by the first amplitude-phase control section 120 in accordance with a desired phase and amplitude, and RF signals are outputted from the first switch bank 140 through a plurality of paths. In other words, the RF signals of the phases 0 and $\pi$ that are inputted from the RF signal generator 130 to the first switch bank 140 are controlled on the basis of the I signal inputted from the delta sigma modulator 110 to the first amplitude-phase control section 120. In the first memory 180, a history of previously selected switches among the plurality of switches constituting the switch bank 140, and a history of the values of previously inputted I signals, are stored. The first amplitude-phase control section 120 updates the histories stored in the first memory 180.

Similarly, the second switch bank 160 is composed of a plurality of switches and further includes power amplifiers for amplifying inputted RF signals. Then, the plurality of switches are controlled by the second amplitude-phase control section 170 in accordance with a desired phase and amplitude, and RF signals are outputted from the second switch bank 160 through a plurality of paths. In other words, the RF signals of the phases $\pi/2$ and $-\pi/2$ that are inputted from the RF signal generator 130 to the second switch bank 160 are controlled on the basis of the Q signal inputted from the delta sigma modulator 110 to the second amplitude-phase control section 170. In the second memory 190, a history of previously selected switches among the plurality of switches constituting the switch bank 160, and a history of the values of previously inputted Q signals, are stored. The second amplitude-phase control section 170 updates the histories stored in the first memory 190.

The combination section 150 combines the RF signals inputted through the pluralities of paths in the first switch bank 140 and the second switch bank 160. Then, an RF signal resulting from the combination is transmitted through an antenna.

Figure 3:
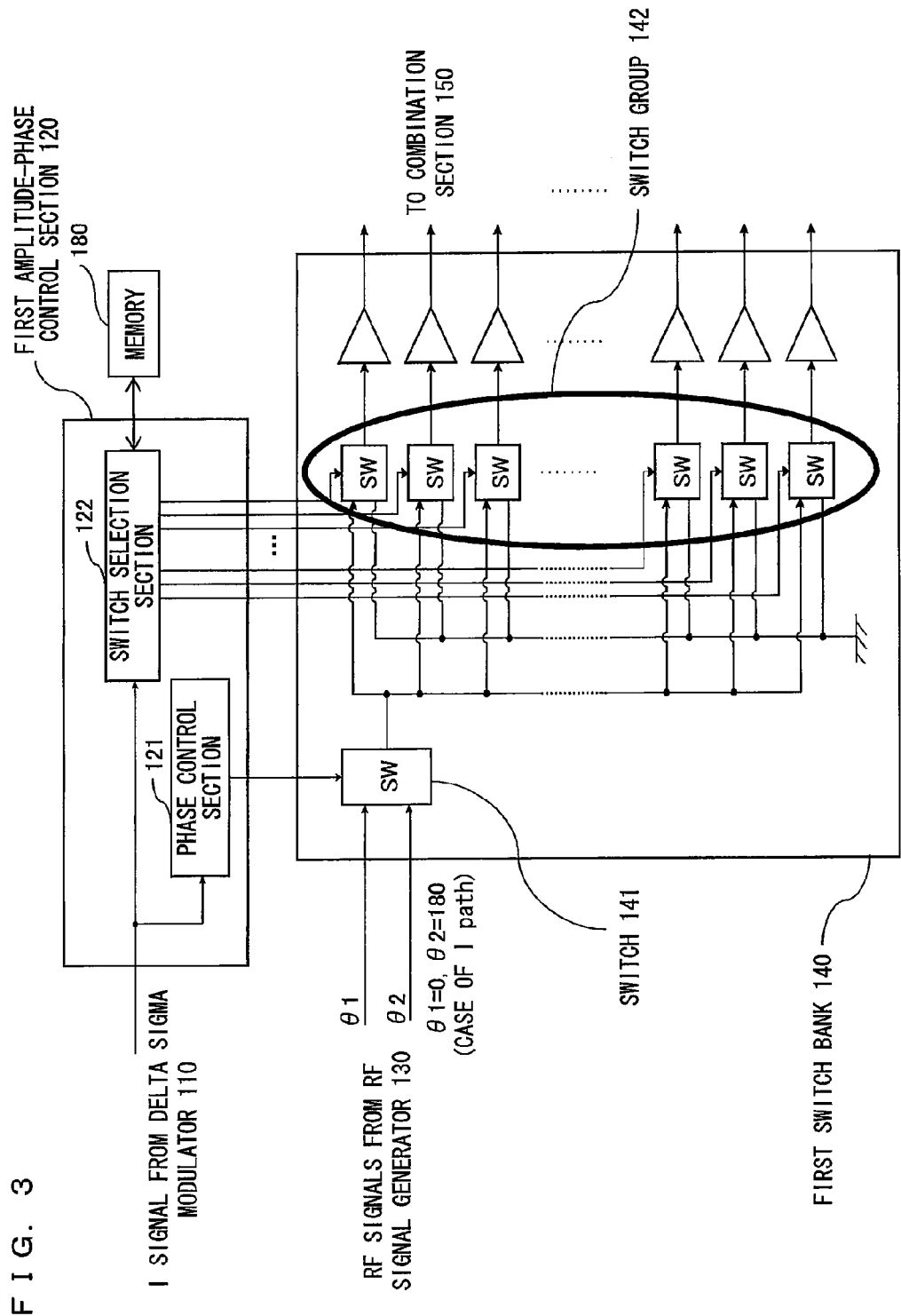
FIG. 3 is a diagram illustrating details of a first amplitude-phase control section 120 and a first switch bank 140.

Here, the first switch bank 140 controlled by the first amplitude-phase control section 120 will be described in detail. FIG. 3 is a diagram illustrating details of the first amplitude-phase control section 120 and the first switch bank 140. The first amplitude-phase control section 120 includes a phase control section 121 and a switch selection section 122. The first switch bank 140 includes a switch 141 and a switch group 142. In addition, the switch group 142 is composed of a plurality of switches.

The phase control section 121 of the first amplitude-phase control section 120 controls the switch 141 of the first switch bank 140. The RF signals (θ1=0, θ2=π) are inputted from the RF signal generator 130 to the switch 141 of the first switch bank 140. The phase control section 121 of the first amplitude-phase control section 120 controls the switch 141 on the basis of the I signal from the delta sigma modulator 110, in order to select either one of θ1 or θ2.

The switch selection section 122 of the first amplitude-phase control section 120 controls ON/OFF of each switch of the switch group 142 of the first switch bank 140. Then, RF signals outputted from switches turned ON in the switch group 142 are outputted through the power amplifiers to the combination section 150. ON/OFF of each switch of the switch group 142 will be described below. The switch selection section 122 stores a history of ON/OFF of each switch of the switch group 142 in the first memory 180.

Next, an algorithm used by the first amplitude-phase control section 120 will be described. The value of an I signal at time $T_n$ is indicated by $X_n$. The starting point of an arrow at $T_n$ is indicated by $k_{1,n}$, the end point of the arrow is indicated by $k_{2,n}$, and the direction from the starting point to the end point of the arrow is indicated by $d_n$. Here, the arrow is a parameter used for controlling the switch 142, and does not indicate positive and negative of the value $X_n$ of the I signal. The meaning of the arrow will be described below with reference to FIG. 5.

First, an operation of the phase control section 121 will be described. In FIG. 3, the phase control section 121 of the first amplitude-phase control section 120 controls the switch 141 of the first switch bank 140 on the basis of the inputted I signal.

When the value $X_n$ of the I signal≦0, the phase control section 121 controls the switch 141 in order to select the RF signal of the phase θ1 among the RF signals of the phases θ1 and θ2 (θ1=0, θ2=180) that are inputted to the switch 141.

Meanwhile, when the value $X_n$ of the I signal<0, the phase control section 121 controls the switch 141 in order to select the RF signal of the phase θ2.

Figure 4:
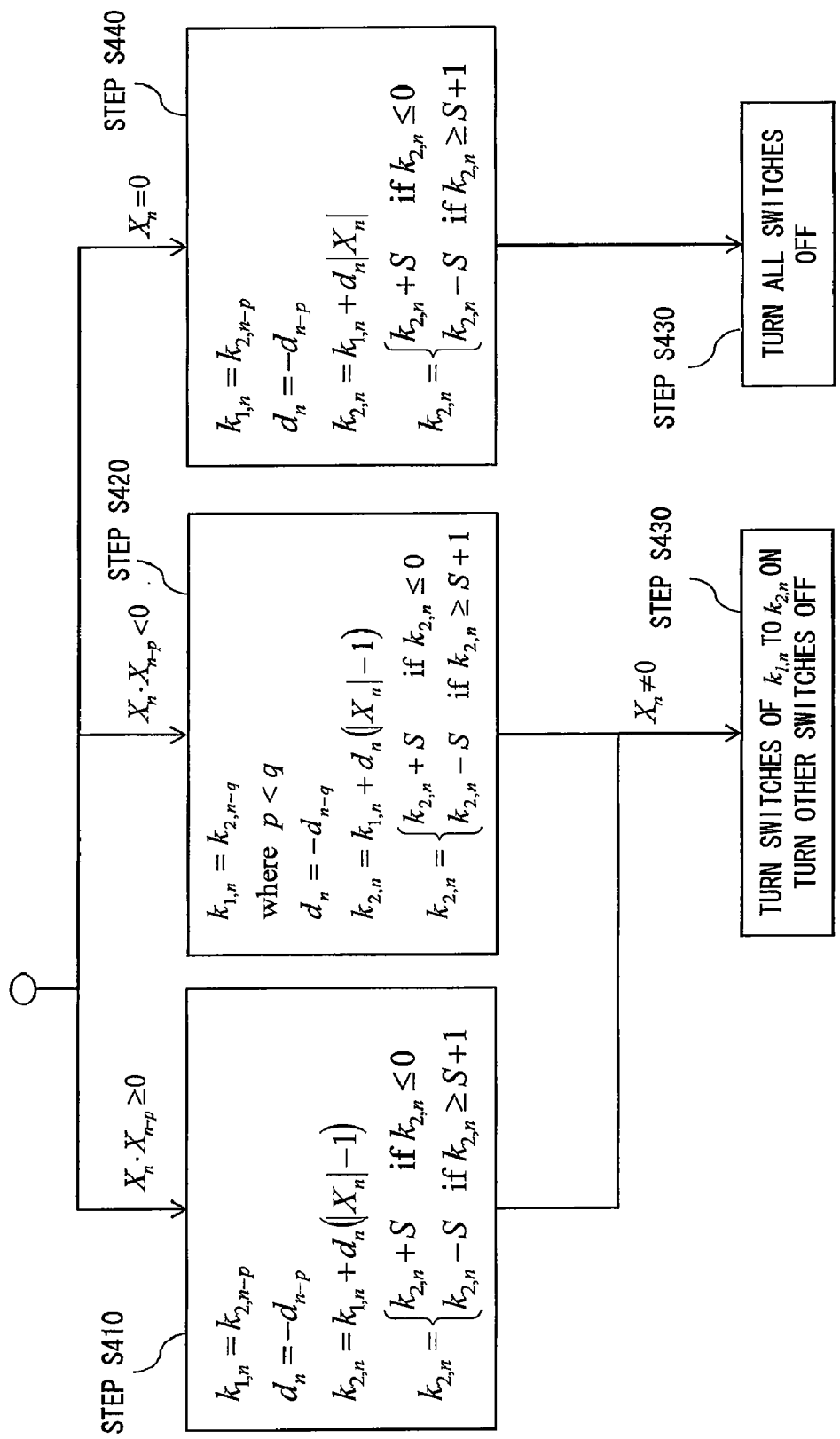
FIG. 4 is a diagram illustrating an algorithm used by a switch selection section 122 of the first amplitude-phase control section 120.

Next, an operation of the first amplitude-phase control section 120 will be described. FIG. 4 is a diagram illustrating an algorithm used by the switch selection section 122 of the first amplitude-phase control section 120.

With regard to the value $X_n$ of the I signal at time $T_n$ and the value $X_{n-p}$ of the I signal at time $T_{n-p}$, in the case of not $X_n$=0, when the sings are the same ($X_n \cdot X_{n-p} \geqq 0$), step S410 is executed, and when the signs are different from each other ($X_n \cdot X_{n-p} < 0$), step S420 is executed. When $X_n$=0, step S440 is executed.

It should be noted that p is a value determined by an obtained transfer function described below.

Specifically, at step S410, the relation of the following Mathematical Formula 1 is satisfied.

$$\left. \begin{array}{l} k_{1,n} = k_{2,n-p} \\ d_n = -d_{n-p} \\ k_{2,n} = k_{1,n} + d_n(|X_n| - 1) \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\}$$ (Mathematical Formula 1)

Here, S is the number of the switches.

Figure 5:
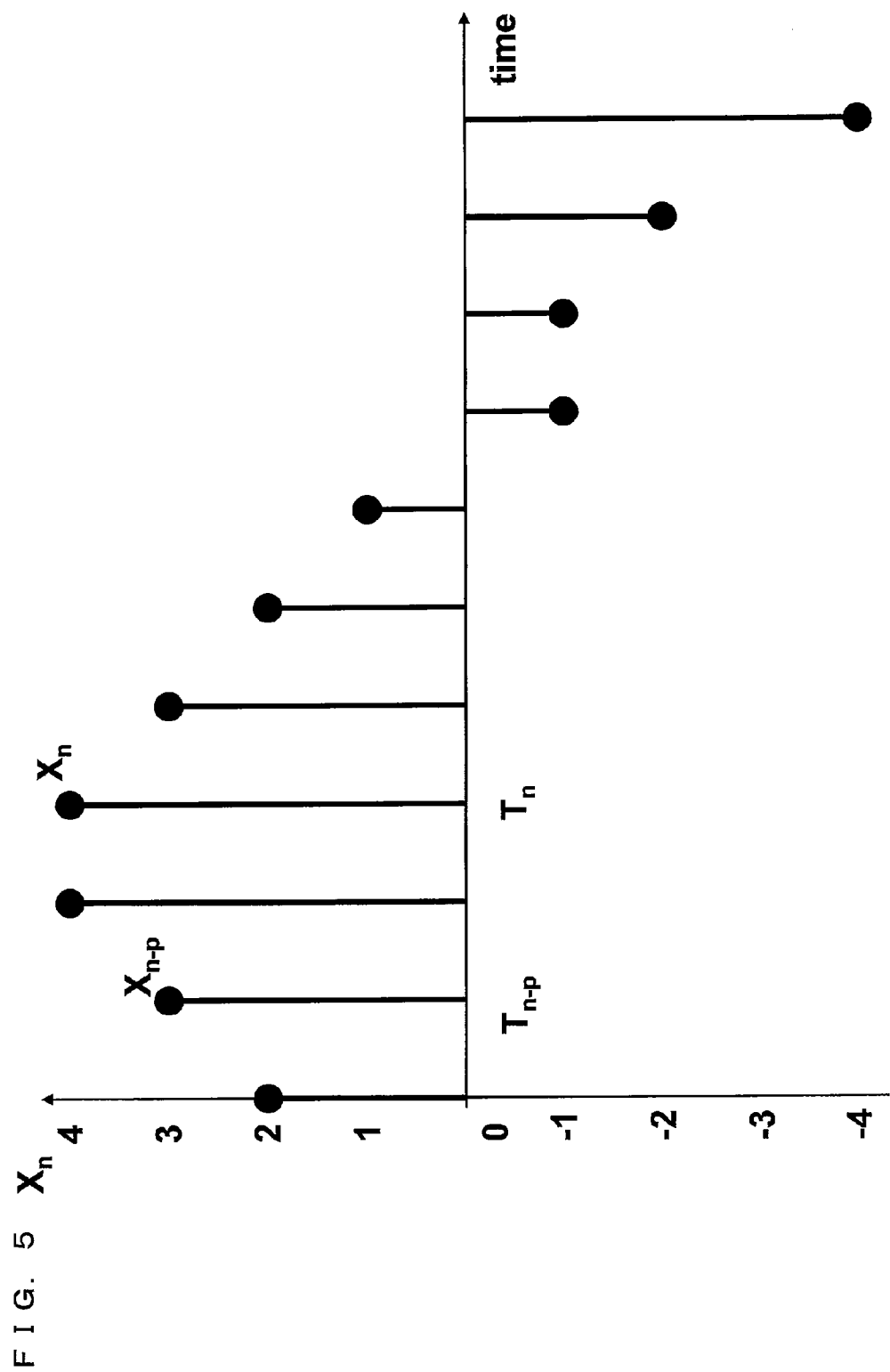
FIG. 5 is a diagram illustrating an example of $X_{n-p}$ and $X_n$ of an I signal.

FIG. 5 illustrates an I signal. The vertical axis indicates the value $X_n$ of the I signal, and the horizontal axis indicates time. Here, the I signal is a digital signal and thus is discretely represented. The value $X_n$ of the I signal at time $T_{n-p}$ is +3, and the value $X_n$ of the I signal at time $T_n$ is +4.

Figure 6:
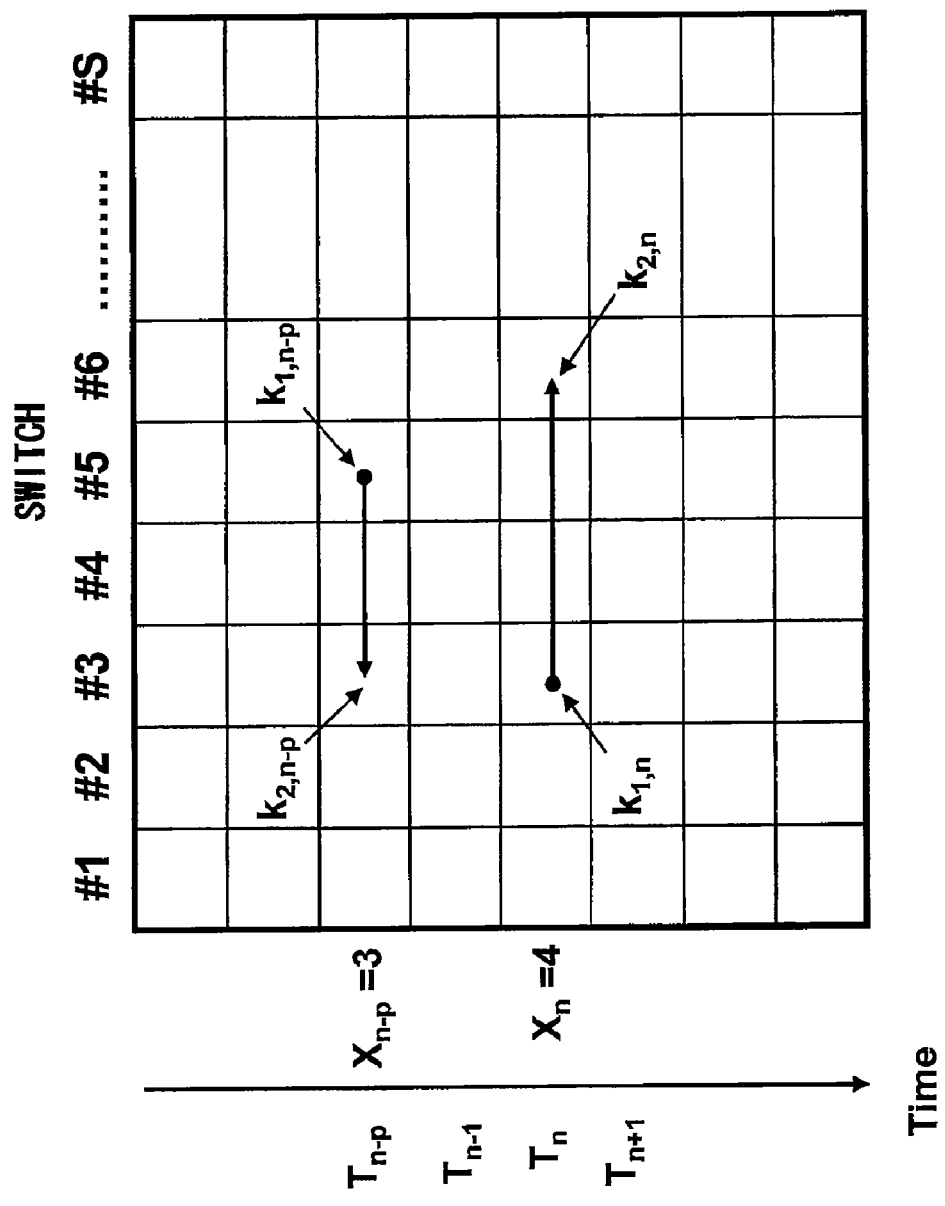
FIG. 6 is a diagram illustrating a situation of a basic process of step 410 using Mathematical Formula 1.

FIG. 6 is a diagram illustrating a basic process of step 410 using Mathematical Formula 1. In FIG. 6, the vertical axis indicates time ($T_{n-p}$, $T_{n-1}$, $T_n$, $T_{n+1}$, ... ), and the horizontal axis indicates the S switches (#1, #2, #S) constituting the switch group 142. Here, the value $X_n$ of the I signal at time $T_{n-p}$ is +3, and the value $X_n$ of the I signal at time $T_n$ is +4.

At steps 410, the starting point at time Tn is set to be the same as the end point at time Tn-p by k1,$n$=k2,n-p in Mathematical Formula 1. Thus, the starting point (k1,$n$) at time Tn is the end point (k2,n-p) at time Tn-p. Here, k2,n-p=3, and thus k1,$n$=3.

At steps 410, the direction (dn) of the arrow at time Tn is set to be opposite to the direction (dn-p) of the arrow at time Tn-p by dn=−dn-p in Mathematical Formula 1. Here, the direction (dn-p) of the arrow at time Tn-p is the direction from the switch #S to the switch #1, and thus the direction (dn) of the arrow at time Tn is the direction from the switch #1 to the switch #S.

In other words, the switches are arranged in ascending order from left to right in FIG. 6. Thus, when the direction ($d_n$) of the arrow is the direction from the switch #S to the switch #1, the arrow is equivalent to (−1). When the direction ($d_n$) of the arrow is the direction from the switch #1 to the switch #S, the arrow is equivalent to (+1).

As described above, the arrow is a parameter used for controlling the switch 142, and does not indicate positive and negative of the value $X_n$ of the I signal.

The end point ($k_{2,n}$) at time $T_n$ is a point moved from the starting point ($k_{1,n}$) at time $T_n$ in the direction ($d_n$) of the arrow by ($|X_n|-1$). Here, $X_n$=4, and thus $k_{2,n}$=6.

Due to the above, at time $T_n$, the switches #3 to #6 from the starting point ($k_{1,n}$=3) of the arrow to the end point ($k_{2,n}$=6) of the arrow are turned ON, and the other switches are turned OFF (step S430 shown in FIG. 4).

Meanwhile, at step S420, the relation of the following Mathematical Formula 2 is satisfied.

$$\left.\begin{array}{l}k_{1,n} = k_{2,n-p} \\ \text{where } p < q \\ d_n = -d_{n-p} \\ k_{2,n} = k_{1,n} + d_n(|X_n|-1) \\ k_{2,n} = \begin{cases} k_{2,n} + S & \text{if } k_{2,n} \leq 0 \\ k_{2,n} - S & \text{if } k_{2,n} \geq S+1 \end{cases}\end{array}\right\}$$ (Mathematical Formula 2)

Here, at step S410, as described above, using Mathematical Formula 1, the starting point $k_{1,n}$, and the direction $d_n$ of the arrow at time $T_n$ are calculated on the basis of the end point $k_{2,n-p}$ and the direction $d_{n-p}$, respectively, of the arrow at time $T_{n-p}$. Meanwhile, at step S420, under the condition of p<q, using Mathematical Formula 2, the starting point $k_{1,n}$ and the direction $d_n$ of the arrow at time $T_n$, are calculated on the basis of the end point $k_2$, n-q and the direction dn-q, respectively, of an arrow at time Tn-q. It should be noted that q is a value determined by the obtained transfer function described below.

Further, at steps S410 and S420, using Mathematical Formula 1 and Mathematical Formula 2 described above, with regard to the end point $k_{2,n}$ of the arrow at time $T_n$, when $k_{2,n} \leq 0$, it is set that $k_{2,n} = k_{2,n} + S$, and when $k_{2,n} \geq S+1$, it is set that $k_{2,n} = k_{2,n} - S$.

Moreover, when the value $X_n$ of the I signal at time $T_n$ is 0, the following Mathematical Formula 3 is calculated (step S440), and all the switches are turned OFF (step S450).

$$\left.\begin{array}{l}k_{1,n} = k_{2,n-p} \\ d_n = -d_{n-p} \\ k_{2,n} = k_{1,n} + d_n|X_n| \\ k_{2,n} = \begin{cases} k_{2,n} + S & \text{if } k_{2,n} \leq 0 \\ k_{2,n} - S & \text{if } k_{2,n} \geq S+1 \end{cases}\end{array}\right\}$$ (Mathematical Formula 3)

Figure 7:
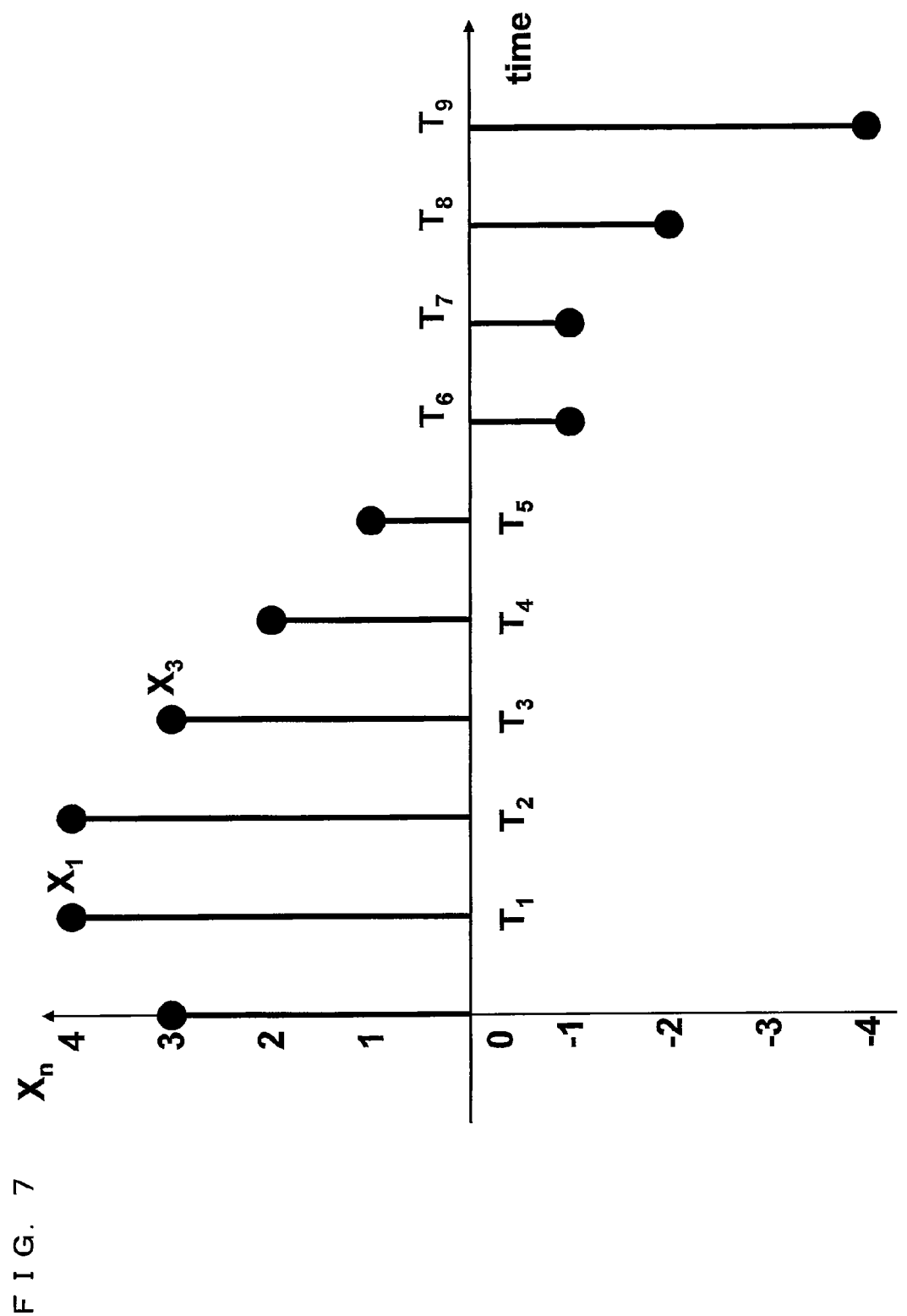
FIG. 7 is a diagram illustrating an example of an I signal.
Figure 8:
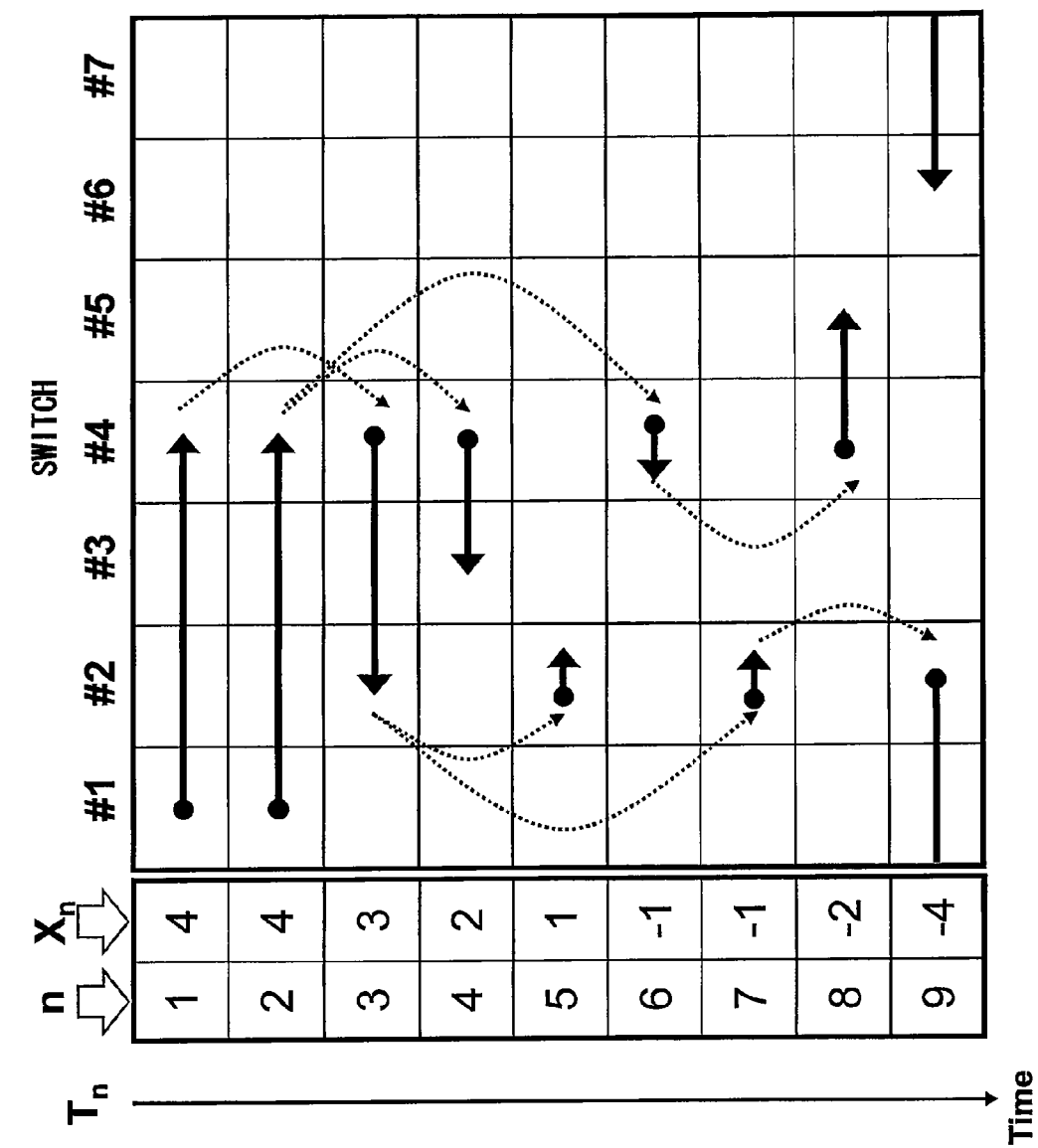
FIG. 8 is a diagram illustrating an example of the case where p=2, q=4, and the number S of switches constituting a switch group 142=7, in the algorithm shown in FIG. 4.

FIG. 7 illustrates an I signal. The vertical axis indicates the value $X_n$ of the I signal, and the horizontal axis indicates time T. The I signal is a digital signal and thus is discretely represented. FIG. 8 is a diagram illustrating an example of the case where p=2, q=4, and the number S of the switches constituting the switch group 142=7, in the algorithm shown in FIG. 4. In the vertical axis, the value ( . . . , $X_{n-1}$, $X_{n+1}$, . . . ) of the I signal at each time is indicated together with time ( . . . , $T_{n-1}$, $T_n$, $T_{n+1}$, . . . ). It should be noted that p and q are values determined by the obtained transfer function described below.

At start of input of the I signal, during a given period of time, for example, during a period corresponding to the value of p or q, a starting point k1 is set to be 1, and the direction ($d_n$) of an arrow is set to be the direction from the switch #1 to the switch #S. Here, p=2, and thus the starting point k1=1 until time $T_2$. It should be noted that it is possible to set an arbitrary point as a starting point.

At time $T_1$, since a starting point $k_{1,1}$=1 and the value $X_1$ of the I signal=4, an end point $k_{1,2}$=1+4−1=4. Thus, the switches #1 to #4 are turned ON, and the other switches are turned OFF.

At time $T_2$, since a starting point $k_2$, 1=1 and the value $X_2$ of the I signal=4, an end point $k_{2,2}$=1+4−1=4. Thus, the switches #1 to #4 are turned ON, and the other switches are turned OFF.

Next, at time $T_3$, since $X_3 \cdot X_1 \geq 0$, step S410 in FIG. 4 is executed. Since p=2, a starting point $k_{3,1}$=the end point $k_{1,2}$=4. The value $X_3$ of the I signal=3, and an arrow d1 at time $T_1$ indicates an ascending order. Thus, an arrow d3 at time $T_3$ indicates a descending order and is equivalent to (−1), and an end point $k_{3,2}$=4+(−1)×(3−1)=2. Therefore, the switches #2 to #4 are turned ON, and the other switches are turned OFF (step S430).

At time $T_4$, since $X_4 \cdot X_2 \geq 0$, step S410 in FIG. 4 is executed. Since p=2, a starting point $k_{4,1}$=the end point $k_{2,2}$=4. The value $X_4$ of the I signal=2, and an arrow d2 at time $T_2$ indicates an ascending order. Thus, an arrow d4 at time $T_4$ indicates a descending order and is equivalent to (−1), and an end point $k_{4,2}$=4+(−1)×(2−1)=3. Therefore, the switches #3 and #4 are turned ON, and the other switches are turned OFF (step S430).

At time $T_5$, since $X_5 \cdot X_3 \geq 0$, step S410 in FIG. 4 is executed. A starting point $k_{5,1}$=the end point $k_{3,2}$=2, the value $X_5$ of the I signal=1, and the arrow d3 at time $T_3$ indicates a descending order. Thus, an arrow d5 at time $T_5$ indicates an ascending order and is equivalent to (+1), and an end point $k_{5,2}$=2+(+1)×(1−1)=2. Therefore, the switch #2 is turned ON, and the other switches are turned OFF (step S430).

At time $T_6$, since $X_6 \cdot X_4 < 0$, step S420 in FIG. 4 is executed. Since q=4, a starting point $k_{6,1}$=the end point $k_2$,2=4. The value $X_6$ of the I signal=−1, and the arrow d2 at time $T_2$ indicates an ascending order. Thus, an arrow d6 at time $T_6$ indicates a descending order and is equivalent to (−1), and an end point $k_{6,2}$=4+(−1)×(=4. Therefore, the switch #4 is turned ON, and the other switches are turned OFF (step S430).

At time $T_7$, since $X_7 \cdot X_5 < 0$, step S420 in FIG. 4 is executed. Since q=4, a starting point $k_{7,1}$=the end point $k_{3,2}$=2. The value $X_7$ of the I signal=−1, and the arrow d3 at time $T_3$ indicates a descending order. Thus, an arrow d7 at time $T_7$ indicates an ascending order and is equivalent to (+1), and an end point $k_{7,2}$=2+(+1)×(|−1|−1)=2. Therefore, the switch #2 is turned ON, and the other switches are turned OFF (step S430).

At time $T_8$, $X_8 \cdot X_6 \geq 0$, and thus step S410 in FIG. 4 is executed. Since p=2, a starting point $k_{8,1}$=the end point $k_{6,2}$=4. The value $X_8$ of the I signal=−2, and the arrow d6 at time $T_6$ indicates a descending order. Thus, an arrow d8 at time $T_8$ indicates an ascending order and is equivalent to (+1), and an end point $k_{8,2}$=4+(+1)×(|−2|−1)=5. Therefore, the switches #4 and #5 are turned ON, and the other switches are turned OFF (step S430).

At time $T_9$, $X_9 \cdot X_7 \geq 0$, and thus step S410 in FIG. 4 is executed. Since p=2, a starting point $k_{9,1}$=an end point k7, 2=2. The value $X_9$ of the I signal=−4, and the arrow d7 at time $T_7$ indicates an ascending order. Thus, an arrow d9 at time $T_9$ indicates a descending order and is equivalent to (−1), and an end point $k_{9,2}$=2+(−1)×(|−4|−1)=−1.

Here, in calculation of the end point $k_{2,9}$ of the arrow, since $k_{2,9} \leq 0$, the end point $k_{2,9}=k_{2,9}+S=−1+7=6$. Then, the switches #1 and #2 and the switches #6 and #7 are turned ON, and the other switches are turned OFF (step S430).

It should be noted that it is set that the starting point k=1 until p=2, but it may be set that the starting point k=1 until q=4.

Then, when the above algorithm is used, a transfer function in mismatch shaping of the present invention is the following Mathematical Formula 4. It is determined whether or not the signs of Xn-p and Xn are the same, and when Xn-p·Xn is positive, signal processing is performed using steps 410 as shown in Mathematical Formula 1. As a result, the transfer function on the upper side is obtained. When Xn-p·Xn is negative, signal processing is performed using steps 420 as shown in Mathematical Formula 2. As a result, the transfer function on the lower side is obtained. Thus, the transfer function is also different.

$$H(z) = \begin{cases} \dfrac{1+z^{-p}}{2} & \text{if } X_n \cdot X_{n-p} \geq 0 \\ \dfrac{1+z^{-q}}{2} & \text{if } X_n \cdot X_{n-p} < 0 \end{cases}$$ (Mathematical Formula 4)

where, $z = e^{j\omega T}$ $\omega$ is angular frequency $T$ is sampling time

Figure 9:
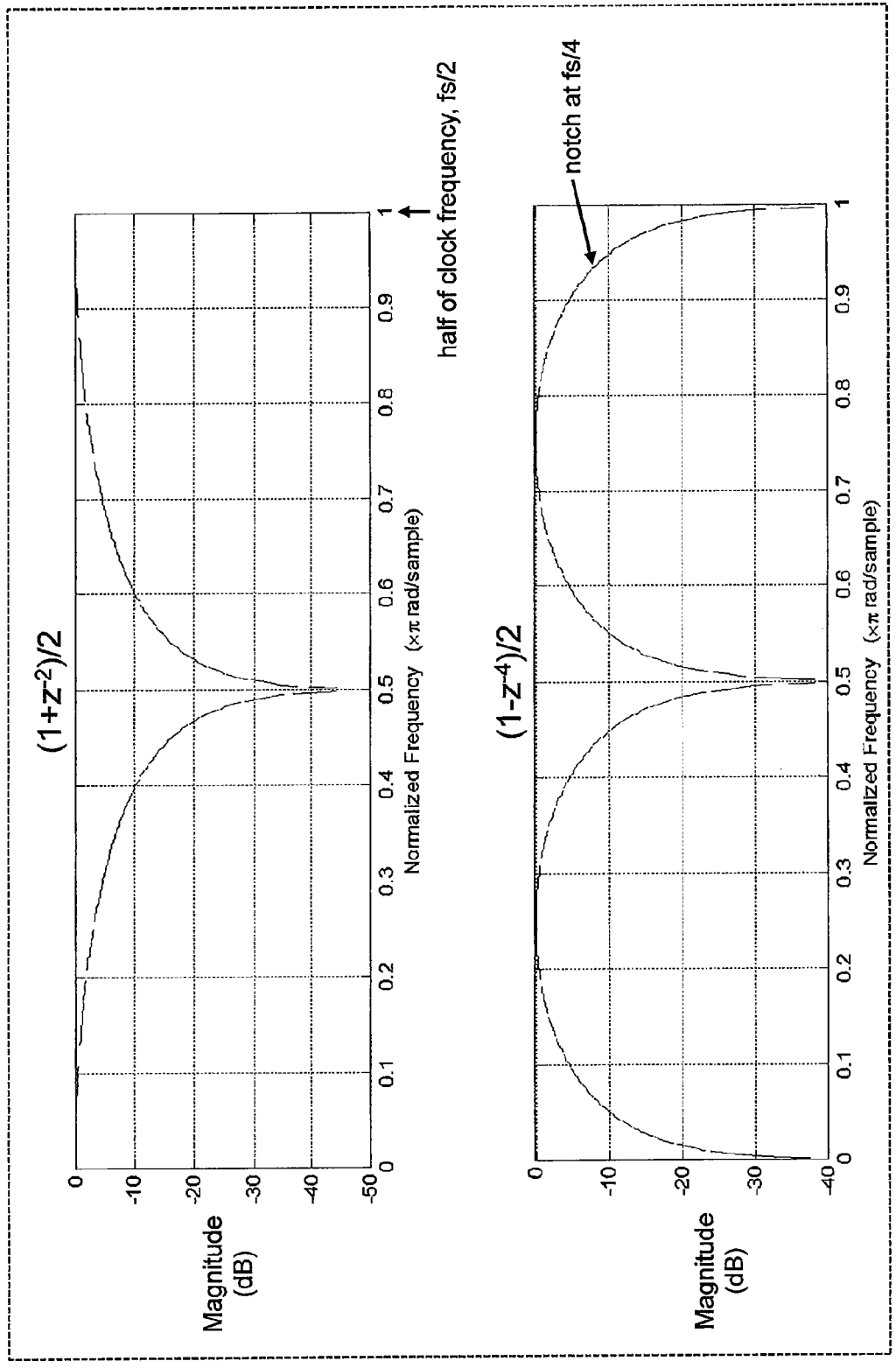
FIG. 9 is a diagram illustrating transfer functions in the case where p=2 and q=4.

FIG. 9 is a diagram illustrating transfer functions in the case where p=2 and q=4. When $X_n \cdot X_{n-p} \geq 0$, using the above Mathematical Formula 1 with p=2 (executing step S410 shown in FIG. 4), the transfer function $H(z)=(1+Z^{-2})/2$. As a result, a notch is generated at 0.5, in the horizontal axis, which is the frequency that is ¼ times that of the clock frequency fs of the switch (½ of the Nyquist frequency). On the other hand, when $X_n \cdot X_{n-p} < 0$, using the above Mathematical Formula 2 with q=4 (executing step S420 shown in FIG. 4), the transfer function $H(z)=(1-Z^{-4})/2$. As a result, notches are generated at 0, 0.5, and 1, in the horizontal axis, which are the frequency that is ¼ times that of the clock frequency fs of the switch.

Figure 10:
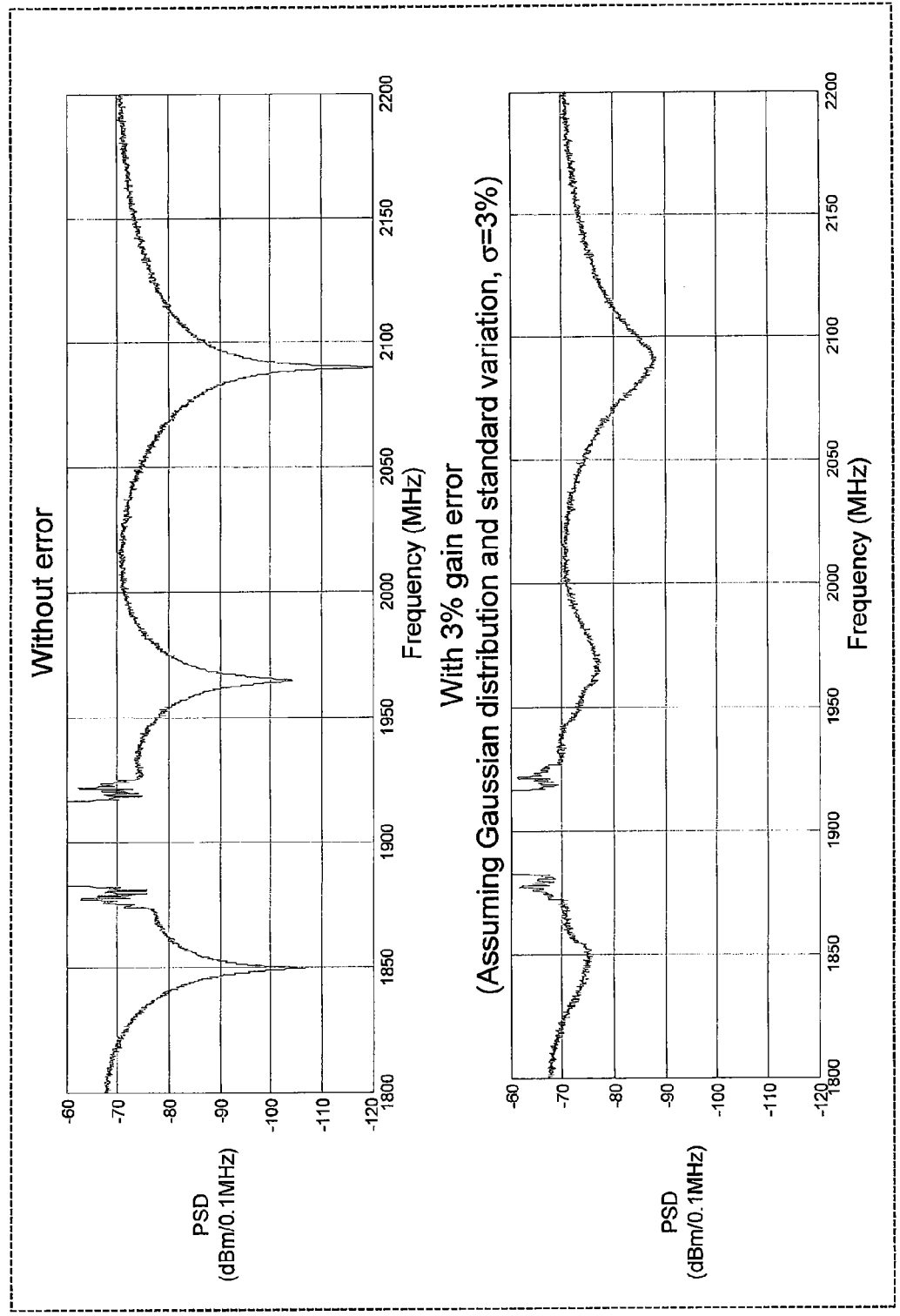
FIG. 10 is a diagram illustrating simulation results in the case where there is no gain error and in the case where there is an gain error.

FIG. 10 is a diagram illustrating simulation results in the case where there is no gain error among S paths and in the case where there is a gain error among the S paths. Here, a carrier frequency=1900 [MHz], the clock frequency fs of the switch=190·4=760 [MHz], the frequency difference between the carrier and a notch=190 [MHz], and an error=3 [%] (as Gaussian distribution, standard deviation s=3 [%]). In the delta sigma modulators 10 and 110, quantization noise is quantized, and shaping is performed such that quantization noise of 2090 MHz is reduced. When there is no gain error, a notch generated in the delta sigma modulator is maintained at a desired frequency. However, when there is a gain error, a notch is masked by an error signal. In other words, the value of the notch is improved from −120 [dBm/0.1 MHz] to −90 [dBm/0.1 MHz] or more.

Figure 11:
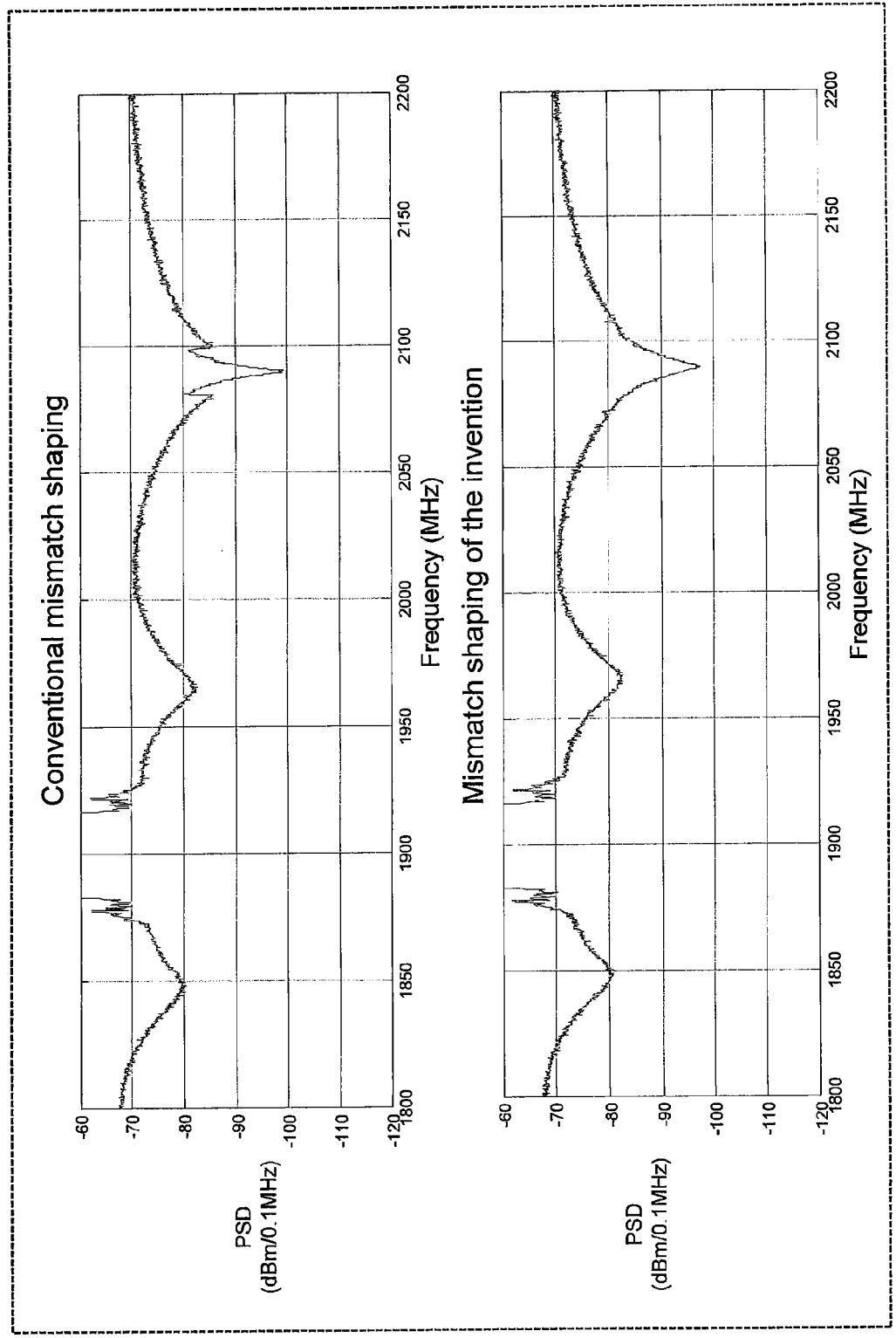
FIG. 11 is a diagram illustrating simulation results in a gain error.

FIG. 11 is a diagram illustrating simulation results when there is a gain error among the S paths and an error signal is shaped using the mismatch shaping technology to reduce influence of the error signal on 2090 MHz. In mismatch shaping in the conventional art, a notch is generated at a desired frequency, but spikes occur around the generated notch. On the other hand, in the mismatch shaping in the present invention, a notch is generated at a desired frequency, and no spikes occur around the generated notch.

Figure 12:
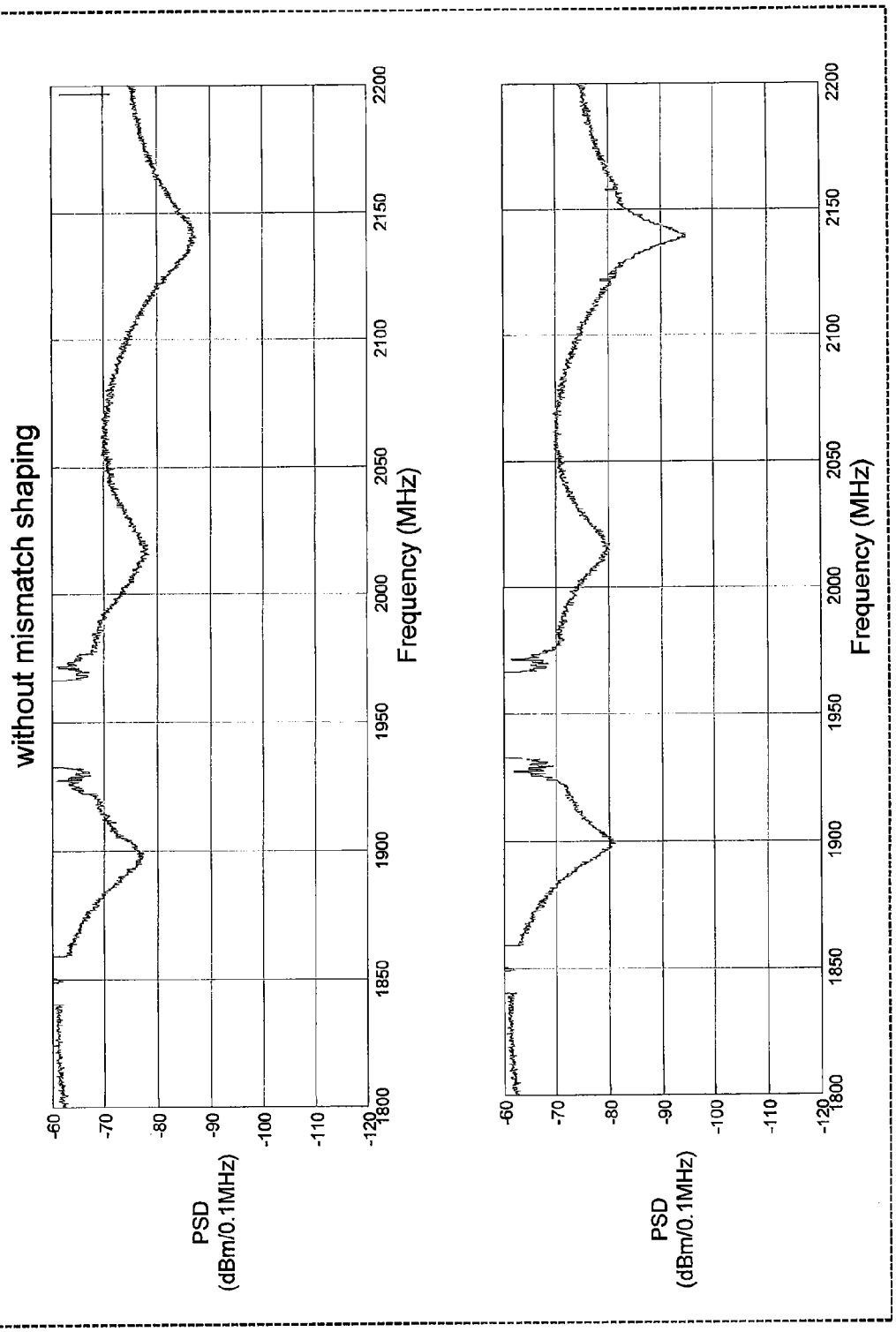
FIG. 12 is a diagram illustrating simulation results in a phase error.

FIG. 12 illustrates simulation results in the case where there is a phase error among the S paths. Here, there is a phase error of 2° [degree]. The upper part of FIG. 12 is a spectrum in the case where mismatch shaping is not performed, and the lower part of FIG. 12 is a spectrum in the case where the mismatch shaping of the present invention is performed. When the mismatch shaping is not performed, a notch generated by delta sigma modulation is masked and disappears. However, in the mismatch shaping of the present invention, a notch generated by delta sigma modulation is maintained.

Figure 13:
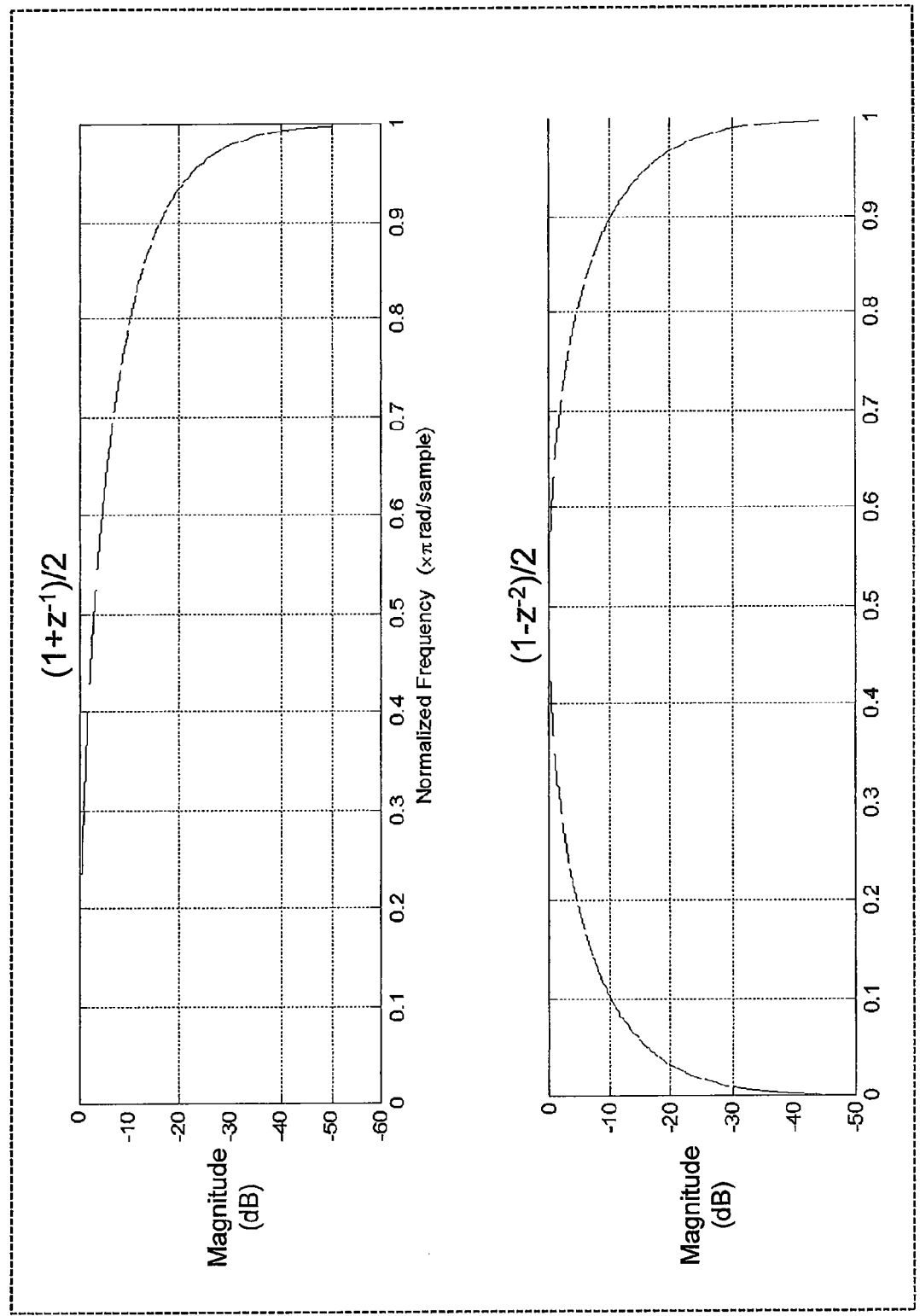
FIG. 13 is a diagram illustrating transfer functions in the case where p=1 and q=2.

FIG. 13 is a diagram illustrating mismatch transfer functions in the case where p=1 and q=2. At fs/2, notches are generated.

Figure 14:
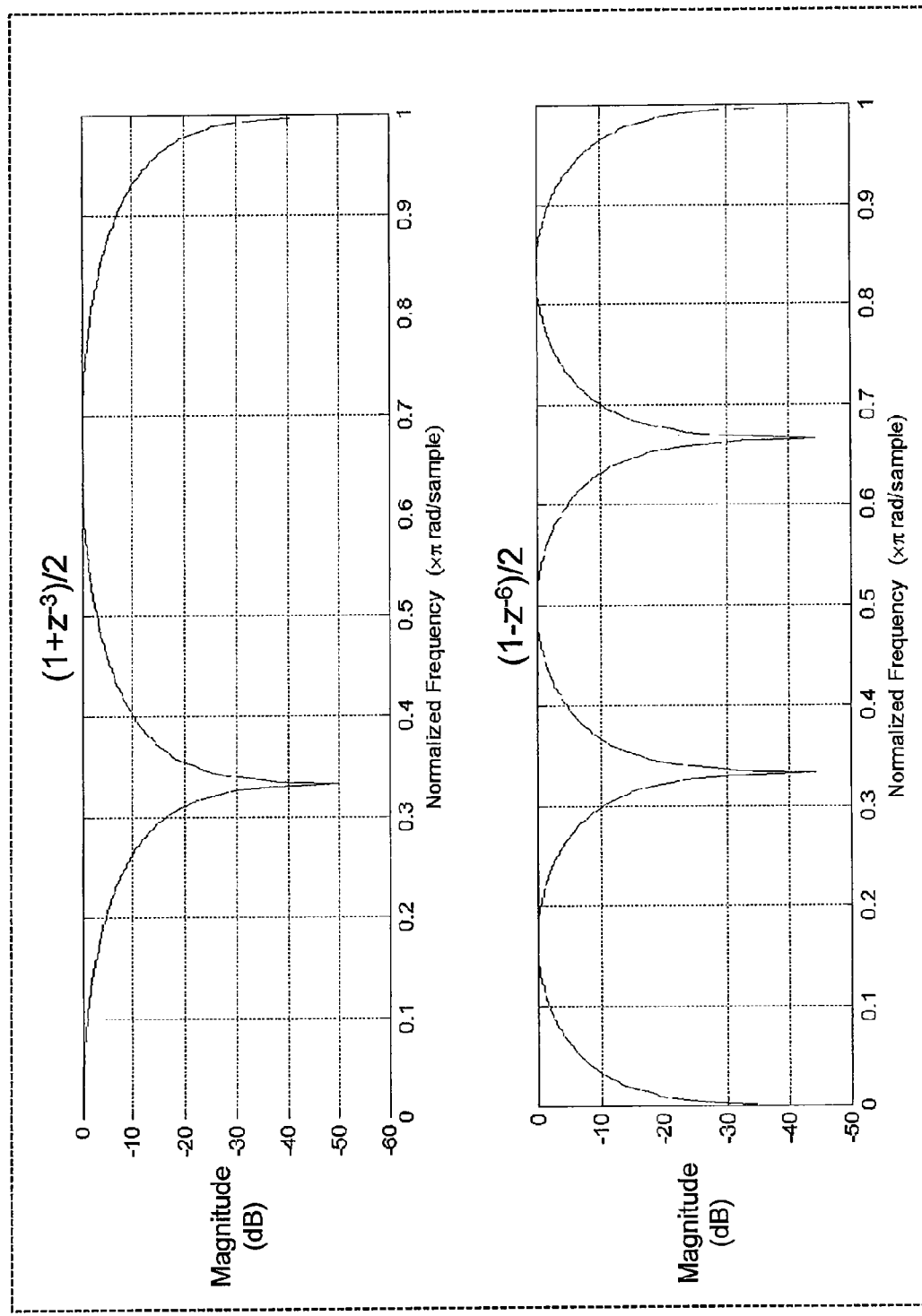
FIG. 14 is a diagram illustrating transfer functions in the case where p=3 and q=6.

FIG. 14 is a diagram illustrating mismatch transfer functions in the case where p=3 and q=6. At fs/6, notches are generated.

The switch control in the first amplitude-phase control section 120 and the first switch bank 140 has been described. In other words, the I signal outputted from the delta sigma modulator 110 and the RF signals (θ1=0, θ2=π) generated by the RF signal generator 130 have been described. It is understood that for switch control in the second amplitude-phase control section 170 and the second switch bank 160, with the Q signal outputted from the delta sigma modulator 110 and the RF signals (θ1=π/2, θ2=−π/2) generated by the RF signal generator 130, the same configuration and process are provided, and the same effects are obtained. The detailed description thereof is omitted. In addition, when great power is not desired, the amplifiers are unnecessary and can be removed.

As described above, according to the RF DAC 100 according to the first embodiment of the present invention, ON/OFF of each switch of the first switch bank 140 and the second switch bank 160 is controlled in consideration of a gain error and a phase error, whereby influence of an error is efficiently shaped, and an error transfer function having a notch for reducing an error signal level in a desired frequency band can be generated.

Modified Example of First Embodiment

Figure 15:
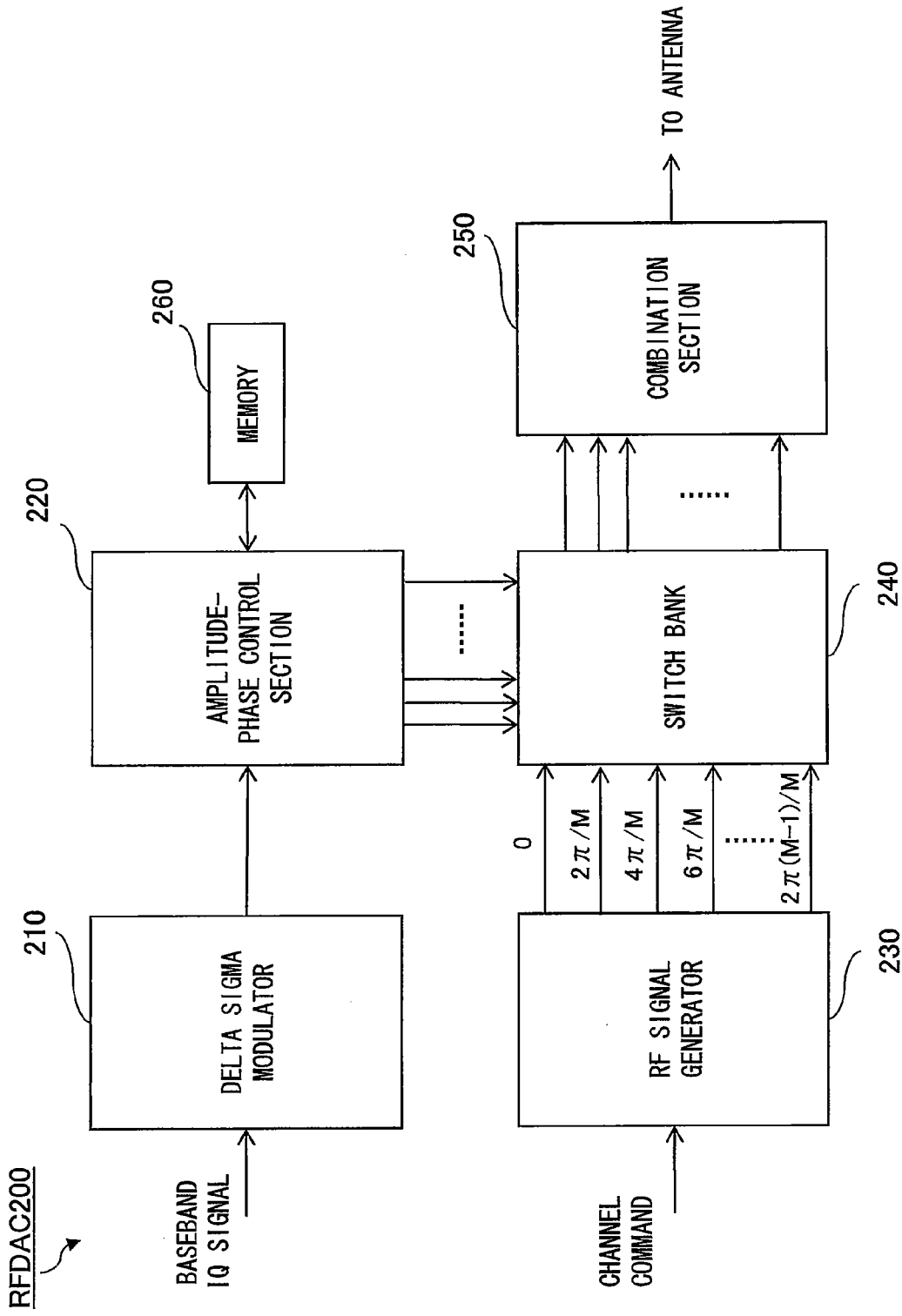
FIG. 15 is a block diagram illustrating an outline of an RF DAC 200 according to a modified example of the first embodiment of the present invention.

FIG. 15 is a block diagram illustrating an outline of an RF DAC 200 according to a modified example of the present embodiment. In FIG. 15, the RF DAC 200 according to the modified example includes a delta sigma modulator 210, an amplitude-phase control section 220, an RF signal generator 230, a switch bank 240, a combination section 250, and a memory 260. The amplitude-phase control section 220 refers to the memory 260 and controls RF signals generated by the RF signal generator 230 described below, on the basis of an I signal and a Q signal outputted from the delta sigma modulator 210.

The amplitude-phase control section 220 refers to the memory 260 and controls the RF signals generated by the RF signal generator 230, on the basis of the I signal and the Q signal outputted from the delta sigma modulator 210.

A channel command is inputted to the RF signal generator 230, and the RF signal generator 230 generates RF signals of a plurality of phases. As a specific example, the RF signal generator 230 generates RF signals of a plurality of phases (0, 2π/M, 4π/M, 6π/M, . . . , 2π(M−1)/M) and outputs the RF signals to the switch bank 240. M denotes an arbitrary integer of 1 or more.

The switch bank 240 is composed of a plurality of switches and further includes power amplifiers for amplifying inputted RF signals. Then, the plurality of switches are controlled by the amplitude-phase control section 220 in accordance with a desired phase and amplitude, and RF signals are outputted from the switch bank 240 through a plurality of paths. In other words, the RF signals of the plurality of phases (0, 2π/M, 4π/M, 6π/M, . . . , 2π(M−1)/M) that are inputted from the RF signal generator 230 to the switch bank 240 are controlled so as to be selected on the basis of the IQ signal inputted from the delta sigma modulator 210 to the amplitude-phase control section 220. In the present embodiment, in an IQ plane, the IQ signal has a phase that is the same as any one of the plurality of phases, and the RF signal of the same phase as that of the IQ signal is selected.

Here, the switch bank 240 controlled by the amplitude-phase control section 220 will be described in detail. FIG. 16 is a diagram illustrating details of the amplitude-phase control section 220 and the switch bank 240. In FIG. 16, the amplitude-phase control section 220 includes a phase control section 221 and a switch selection section 222. The switch bank 240 includes a switch 241 and a switch group 242. In addition, the switch group 242 is composed of a plurality of switches.

The phase control section 221 of the amplitude-phase control section 220 controls the switch 241 of the switch bank 240. Specifically, the RF signals (0, 2π/M, 4π/M, 6π/M, ..., 2π(M−1)/M) are inputted from the RF signal generator 230 to the switch 241 of the switch bank 240. The phase control section 221 of the amplitude-phase control section 220 controls the switch 241 in order to select the RF signal (0, 2π/M, 4π/M, 6π/M, ..., 2π(M−1)/M) of the same phase as that of the IQ signal from the delta sigma modulator 210.

The switch selection section 222 of the amplitude-phase control section 220 controls ON/OFF of each switch of the switch group 242 of the switch bank 240. Then, RF signals outputted from switches turned ON in the switch group 242 are outputted through the power amplifiers to the combination section 250. The switch selection section 222 stores a history of ON/OFF of each switch of the switch group 242 in the memory 260. In addition, in the memory 260, a history of the values of previously inputted IQ signals is stored.

Next, an algorithm used by the amplitude-phase control section 220 will be described. An I signal and a Q signal at time $T_n$, are indicated by In and Qn, and the value of the signal is indicated by $X_n$. Then, the starting point of an arrow at $T_n$, is indicated by $k_{1,n}$, the end point of the arrow is indicated by $k_{2,n}$, and the direction from the starting point to the end point of the arrow is indicated by $d_n$. It should be noted that the meaning of the arrow is as described above.

Figure 17:
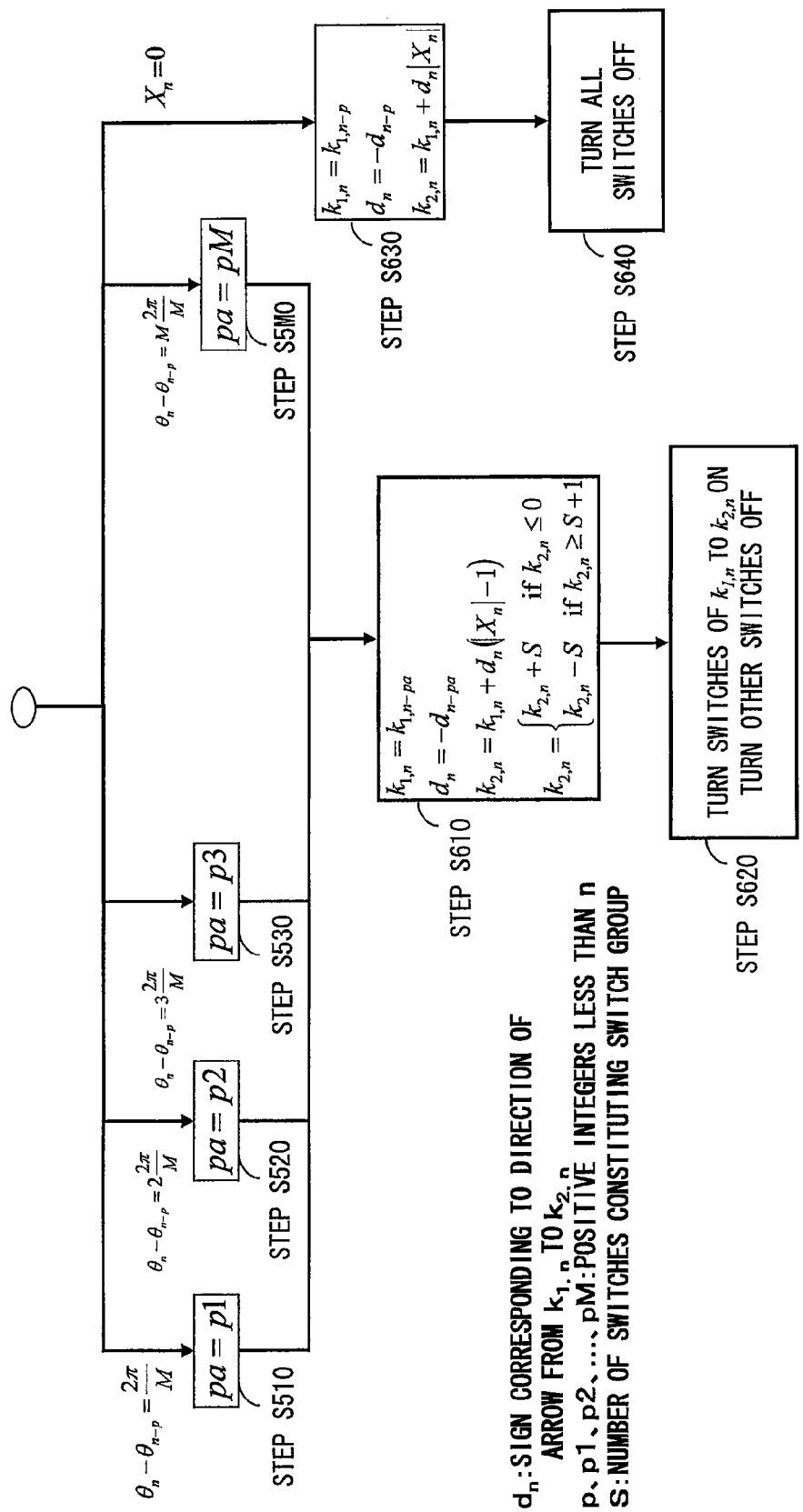
FIG. 17 is a diagram illustrating an algorithm used by a switch selection section 222 of the amplitude-phase control section 220.

FIG. 17 illustrates an algorithm used by the switch selection section 222 of the amplitude-phase control section 220. In FIG. 17, with regard to the value $θ_n$ of a phase θ at time $T_n$ and the value $θ_{n-p}$ of the phase θ at time $T_{n-p}$, when $θ_n-θ_{n-p}=2π/M$, step S510 is executed; when $θ_n-θ_{n-p}=2·2π/M$, step S520 is executed; when $θ_n-θ_{n-p}=3·π/2$, step S530 is executed; when $θ_n-θ_{n-p}=M·2π/M$, step S5M0 is executed; and when $X_n=0$, step S630 is executed.

Further, when having executed step S510, S520, S530, or S5M0, the switch selection section 222 executes step S610, and at time $T_n$, the switches of $k_{1,n}$ to $k_{2,n}$ are turned ON and the other switches are turned OFF. In addition, when having executed step S630, the switch selection section 222 executes step S640 and turns all the switches OFF. The specific process is as described with reference to FIGS. 5 to 8, and thus the description thereof is omitted.

As described above, according to the RF DAC of the present invention, ON/OFF of each switch of the switch bank is controlled in consideration of a gain error and a phase error, whereby a transfer function having a notch for reducing a signal level in a desired frequency band can be generated.

Second Embodiment

FIG. 18A is a block diagram illustrating an outline of an RF DAC 300 according to a second embodiment of the present invention. In FIG. 18A, the RF DAC 300 according to the second embodiment includes a delta sigma modulator 310, an amplitude-phase control section 320, an RF signal generator 330, a switch bank 340, a combination section 350, and a memory 360.

Figure 18B:
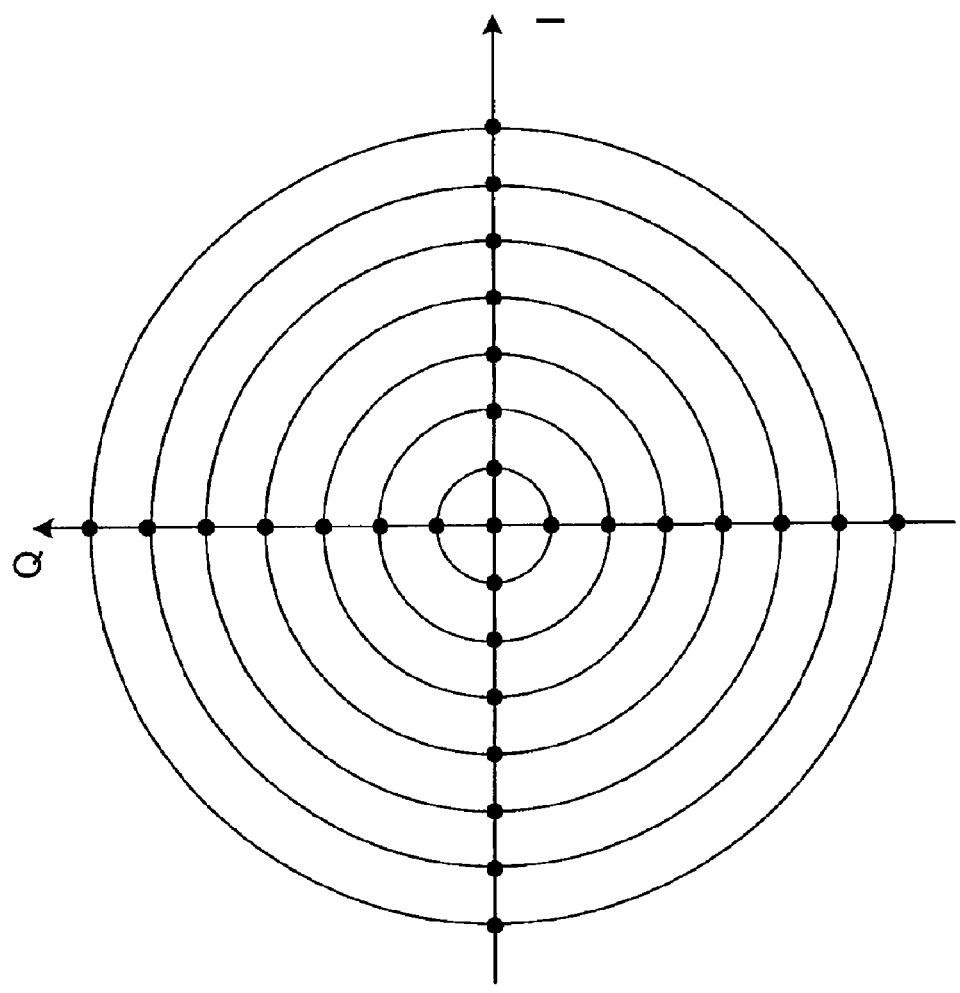
FIG. 18B is an IQ plane diagram showing symbol positions represented by IQ signals inputted to the RF DAC 300.

A baseband IQ signal is inputted to the delta sigma modulator 310. The delta sigma modulator 310 quantizes the inputted baseband IQ signal, performs noise shaping, and then outputs an I signal (in-phase signal) and a Q signal (quadrature-phase signal). In the present embodiment, the I signal and the Q signal outputted from the delta sigma modulator 310 represent symbols on an I axis or a Q axis. FIG. 18B illustrates an example of a symbol arrangement on an IQ plane. Each circle shown in FIG. 18B represents the same amplitude, and black points represent symbols.

The amplitude-phase control section 320 refers to the memory 360 described below, and controls RF signals generated by the RF signal generator 330 described below, on the basis of the I signal and the Q signal outputted from the delta sigma modulator 310.

A channel command is inputted to the RF signal generator 330, and the RF signal generator 330 generates RF signals of at least four phases. As a specific example, the RF signal generator 330 generates RF signals of four phases (0, π, π/2, −π/2) and outputs the RF signals of the phases (0, π, π/2, and −π/2) to the switch bank 340.

The switch bank 340 is composed of a plurality of switches and further includes power amplifiers for amplifying inputted RF signals. Then, the plurality of switches are controlled by the first amplitude-phase control section 320 in accordance with a desired phase and amplitude, and RF signals are outputted from the first switch bank 340 through a plurality of paths. In other words, the RF signals of the phases θ, π, π/2, and −π/2 that are inputted from the RF signal generator 330 to the switch bank 340 are controlled on the basis of the IQ signal inputted from the delta sigma modulator 310 to the amplitude-phase control section 320. In the memory 360, a history of previously selected switches among the plurality of switches constituting the switch bank 340, and a history of the values of previously inputted IQ signals, are stored. The amplitude-phase control section 320 updates the histories stored in the memory 360.

The combination section 350 combines the RF signals inputted through the plurality of paths in the switch bank 340. Then, an RF signal resulting from the combination is transmitted through an antenna.

Figure 19:
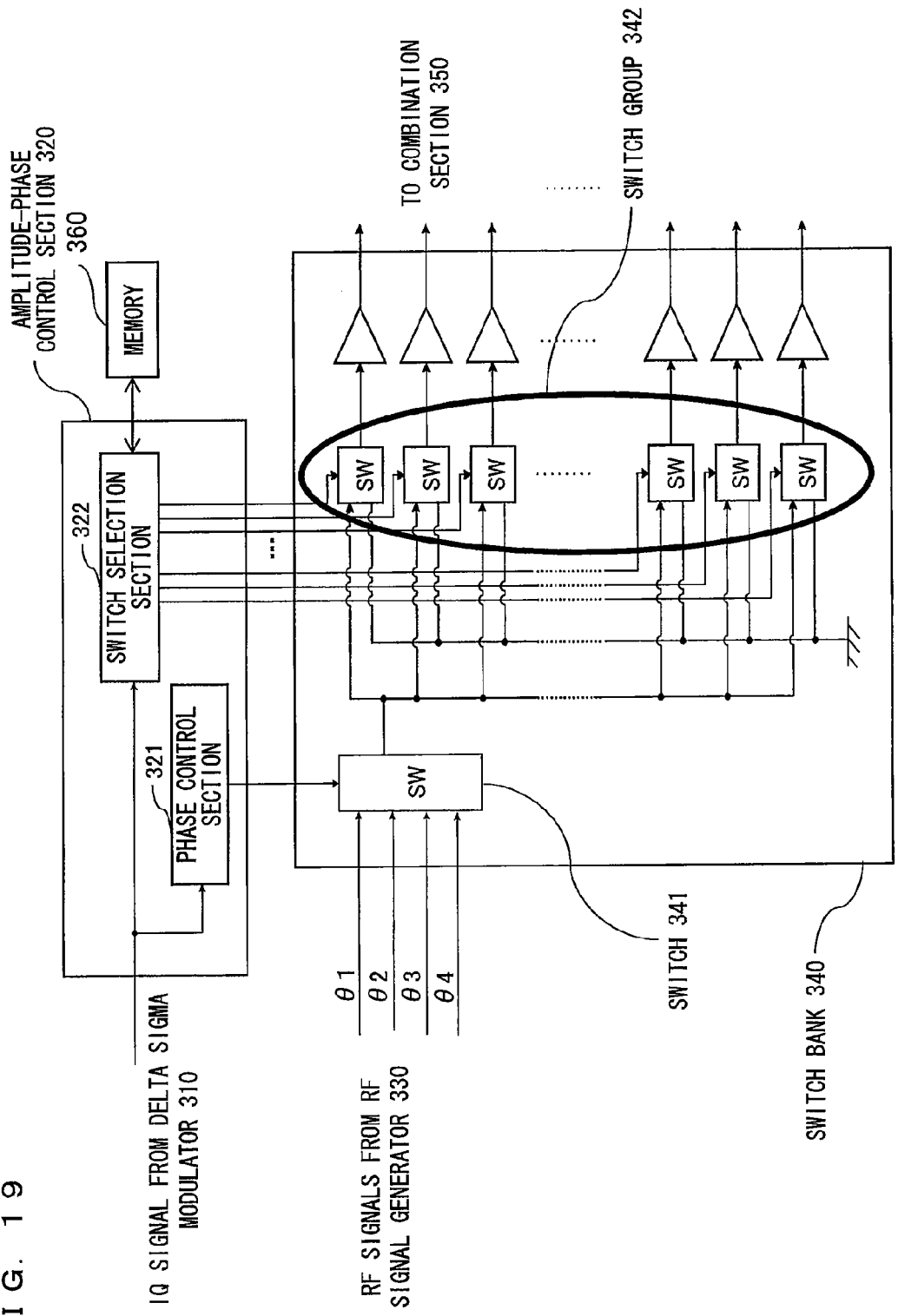
FIG. 19 is a diagram illustrating details of an amplitude-phase control section 320 and a switch bank 340.

Here, the switch bank 340 controlled by the amplitude-phase control section 320 will be described in detail. FIG. 19 is a diagram illustrating details of the amplitude-phase control section 320 and the switch bank 340. In FIG. 19, the amplitude-phase control section 320 includes a phase control section 321 and a switch selection section 322. The switch bank 340 includes a switch 341 and a switch group 342. In addition, the switch group 342 is composed of a plurality of switches.

The phase control section 321 of the amplitude-phase control section 320 controls the switch 341 of the switch bank 340. Specifically, the RF signals (θ1=0, θ2=π/2, θ3=π, θ4=−π/2) are inputted from the RF signal generator 330 to the switch 341 of the switch bank 340. The phase control section 321 of the amplitude-phase control section 320 controls the switch 341 on the basis of the IQ signal from the delta sigma modulator 310, in order to select any of θ1, θ2, θ3, and θ4. In the present embodiment, the IQ signal is a signal for delta sigma modulation based on a high-speed clock, and is a signal representing a symbol mapped on the I axis or the Q axis on the IQ plane. From θ1, θ2, θ3, and θ4, the same phase as the phase of the IQ signal is selected.

The switch selection section 322 of the amplitude-phase control section 320 controls ON/OFF of each switch of the switch group 342 of the switch bank 340. Then, RF signals outputted from switches turned ON in the switch group 342 are outputted through the power amplifiers to the combination section 350. ON/OFF of each switch of the switch group 342 will be described below. The switch selection section 222 stores a history of ON/OFF of each switch of the switch group 342 in the memory 360.

Next, an algorithm used by the amplitude-phase control section 320 will be described. The amplitude of an IQ signal at time $T_n$ is indicated by $|X_n|$. Then, the starting point of an arrow at $T_n$ is indicated by $k_{1,n}$ the end point of the arrow is indicated by $k_{2,n}$, and the direction from the starting point to the end point of the arrow is indicated by $d_n$. It should be noted that the meaning of the arrow is as described above.

FIG. 20 illustrates an algorithm used by the switch selection section 322 of the amplitude-phase control section 320. In FIG. 20, with regard to the value $\theta_n$ of a phase $\theta$ at time $T_n$, and the value $\theta_{n-p}$ of the phase $\theta$ at time $T_{n-p}$, when $\theta_n=\theta_{n-p}+\pi/2$, step S710 is executed; when $\theta_n=\theta_{n-p}$, step S720 is executed; when $\theta_n=\theta_{n-p}-\pi/2$, step S730 is executed; when $\theta_n=\theta_{n-p}+\pi$, step S740 is executed; and when $X_n=0$, step S750 is executed.

Further, when having executed step S710, S720, S730, or S740, the switch selection section 322 executes step S750, and at time $T_n$, the switches of $k_{1,n}$ to $k_{2,n}$ are turned ON and the other switches are turned OFF. In addition, when having executed step S750, the switch selection section 322 executes step S770 and turns all the switches OFF. The specific process is as described with reference to FIGS. 5 to 8, and thus the description thereof is omitted.

FIG. 21 is a diagram illustrating transfer functions in the case where p1=1, p2=2, p3=3, p4=4, and p=1. At fs/4, notches are generated. As a result, when a gain/phase error occurs, an error signal caused by the error is shaped, and notches can be generated at fs/4.

Modified Example of Second Embodiment

Figure 22A:
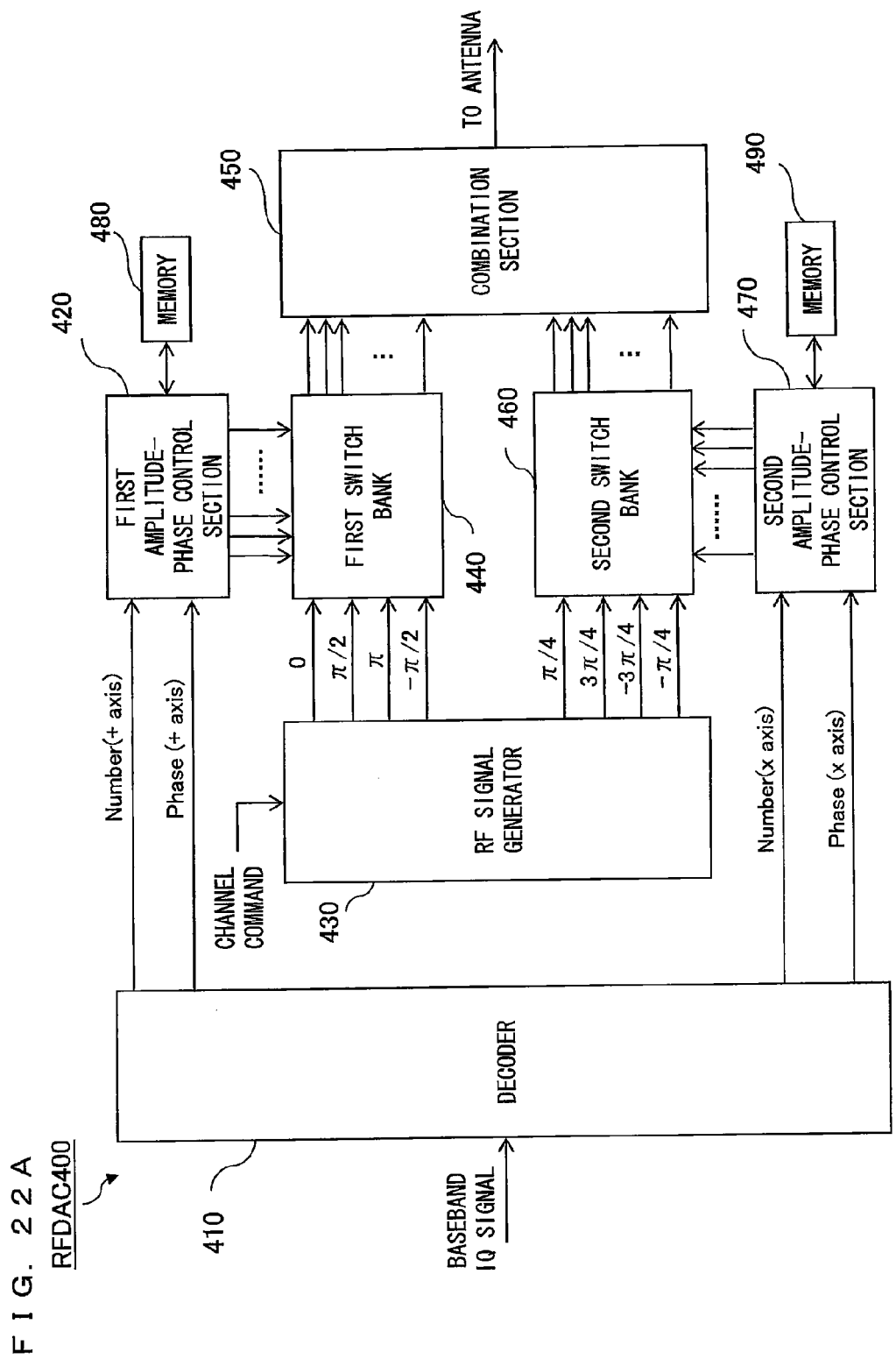
FIG. 22A is a block diagram illustrating an outline of an RF DAC 400 according to a modified example of the second embodiment of the present invention.

Hereinafter, an RF DAC 400 according to a modified example of the present embodiment will be described with reference to FIG. 22A. In FIG. 22A, the RF DAC 400 includes a decoder 410, a first amplitude-phase control section 420, a second amplitude-phase control section 470, an RF signal generator 430, a first switch bank 440, a second switch bank 460, a combination section 450, a first memory 480, and a second memory 490.

Figure 22B:
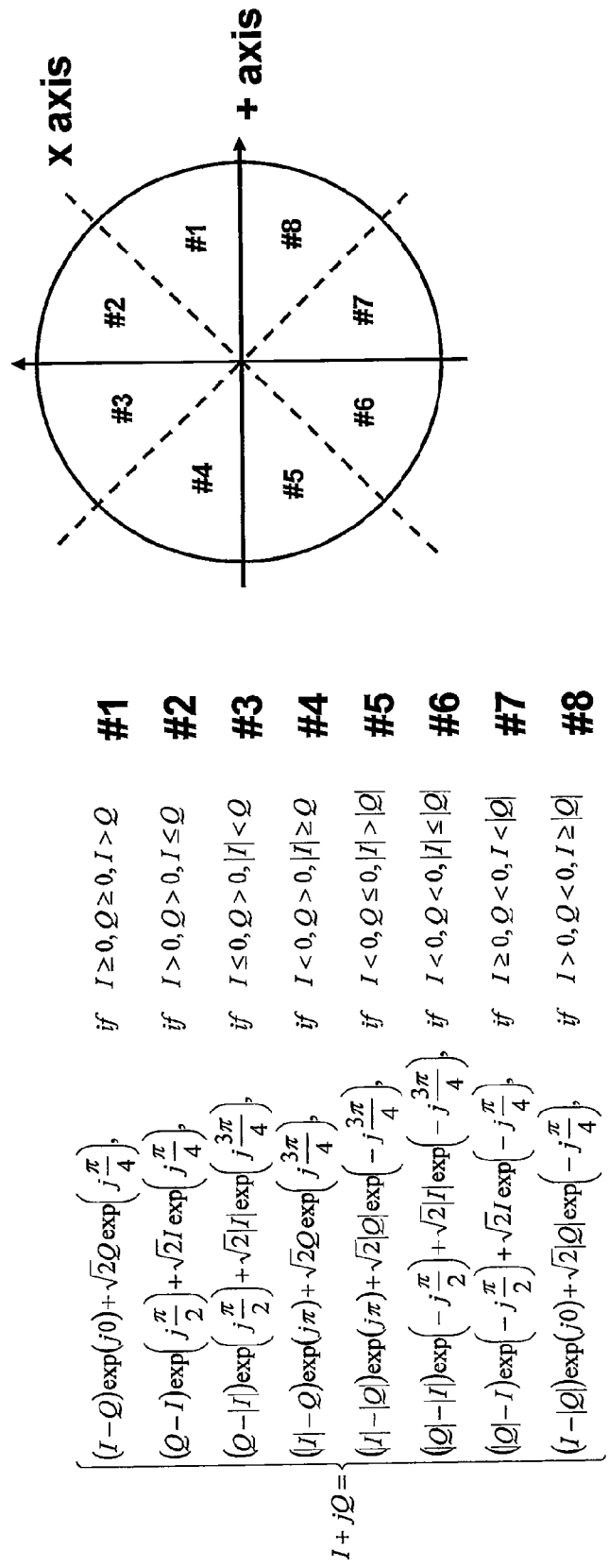
FIG. 22B is a diagram illustrating signal conversion in the RF DAC 400.

In FIG. 22A, the decoder 410 generates Number (+axis), Phase (+axis), Number (x axis), and Phase (x axis). The relation between an IQ signal and Number (+axis), Phase (+axis), Number (x axis), and Phase (x axis) are defined by formulas shown in FIGS. 22B and 22C.

The first amplitude-phase control section 420 refers to the first memory 480 described below, and controls RF signals generated by the RF signal generator 430 described below, on the basis of Number (+axis) and Phase (+axis) outputted from the decoder 410.

Meanwhile, the second amplitude-phase control section 470 refers to the second memory 490 described below, and controls RF signals generated by the RF signal generator 430 described below, on the basis of Number (x axis) and Phase (x axis) outputted from the decoder 410.

A channel command is inputted to the RF signal generator 430, and the RF signal generator 430 generates RF signals of eight phases. As a specific example, the RF signal generator 430 generates RF signals of eight phases (0, $\pi/2$, $\pi$, $-\pi/2$, $\pi/4$, $3\pi/4$, $-3\pi/4$, $-\pi/4$), outputs the RF signals of four phases (0, $\pi/2$, $\pi$, $-\pi/2$) to the first switch bank 440, and outputs the RF signals of four phases ($\pi/4$, $3\pi/4$, $-3\pi/4$, $-\pi/4$) to the second switch bank 460.

The first switch bank 440 is composed of a plurality of switches and further includes power amplifiers for amplifying inputted RF signals. Then, the plurality of switches are controlled by the first amplitude-phase control section 420 in accordance with a desired phase and amplitude, and RF signals are outputted from the first switch bank 440 through a plurality of paths.

In other words, the RF signals of the four phases (0, $\pi/2$, $\pi$, $-\pi/2$) that are inputted from the RF signal generator 330 to the first switch bank 440 are selected on the basis of Phase (+axis) inputted from the decoder 410 to the first amplitude-phase control section 420. It should be noted that Number (+axis) is used instead of the I signal in the embodiment described above.

In the first memory 480, a history of previously selected switches among the plurality of switches constituting the first switch bank 440, and a history of the values of previous Number (+axis) and Phase (+axis), are stored. The first amplitude-phase control section 420 updates the histories stored in the first memory 480.

Similarly, the second switch bank 460 is composed of a plurality of switches and further includes power amplifiers for amplifying inputted RF signals. Then, the plurality of switches are controlled by the second amplitude-phase control section 470 in accordance with a desired phase and amplitude, and RF signals are outputted from the second switch bank 460 through a plurality of paths.

In other words, the RF signals of the four phases ($\pi/4$, $3\pi/4$, $-3\pi/4$, $-\pi/4$) that are inputted from the RF signal generator 430 to the second switch bank 460 are selected on the basis of Phase (x axis) inputted from the decoder 410 to the second amplitude-phase control section 470. It should be noted that Number (x axis) is used instead of the Q signal in the embodiment described above.

In the second memory 490, a history of previously selected switches among the plurality of switches constituting the second switch bank 460, and a history of the values of previous Number (x axis) and Phase (x axis), are stored. The second amplitude-phase control section 470 updates the histories stored in the second memory 490. It should be noted that an output of one unit of the second switch bank 460 is preferably set so as to be $\sqrt{2}$ times that of an output of one unit of the first switch bank in accordance with the second term in each formula in FIG. 22B.

The combination section 450 combines the RF signals inputted through the pluralities of paths in the first switch bank 440 and the second switch bank 460. Then, an RF signal resulting from the combination is transmitted through an antenna.

Algorithms used by the first amplitude-phase control section 420 and the second amplitude-phase control section 470 are the same as the algorithm described with reference to FIG. 20, and thus the description thereof is omitted.

A radio transmitting/receiving apparatus can be composed of a transmitter in which the RF DAC according to each of the above-described embodiments and modified examples of the present invention is used, a receiver, an antenna, and an antenna switch connecting them.

Third Embodiment

Figure 23:
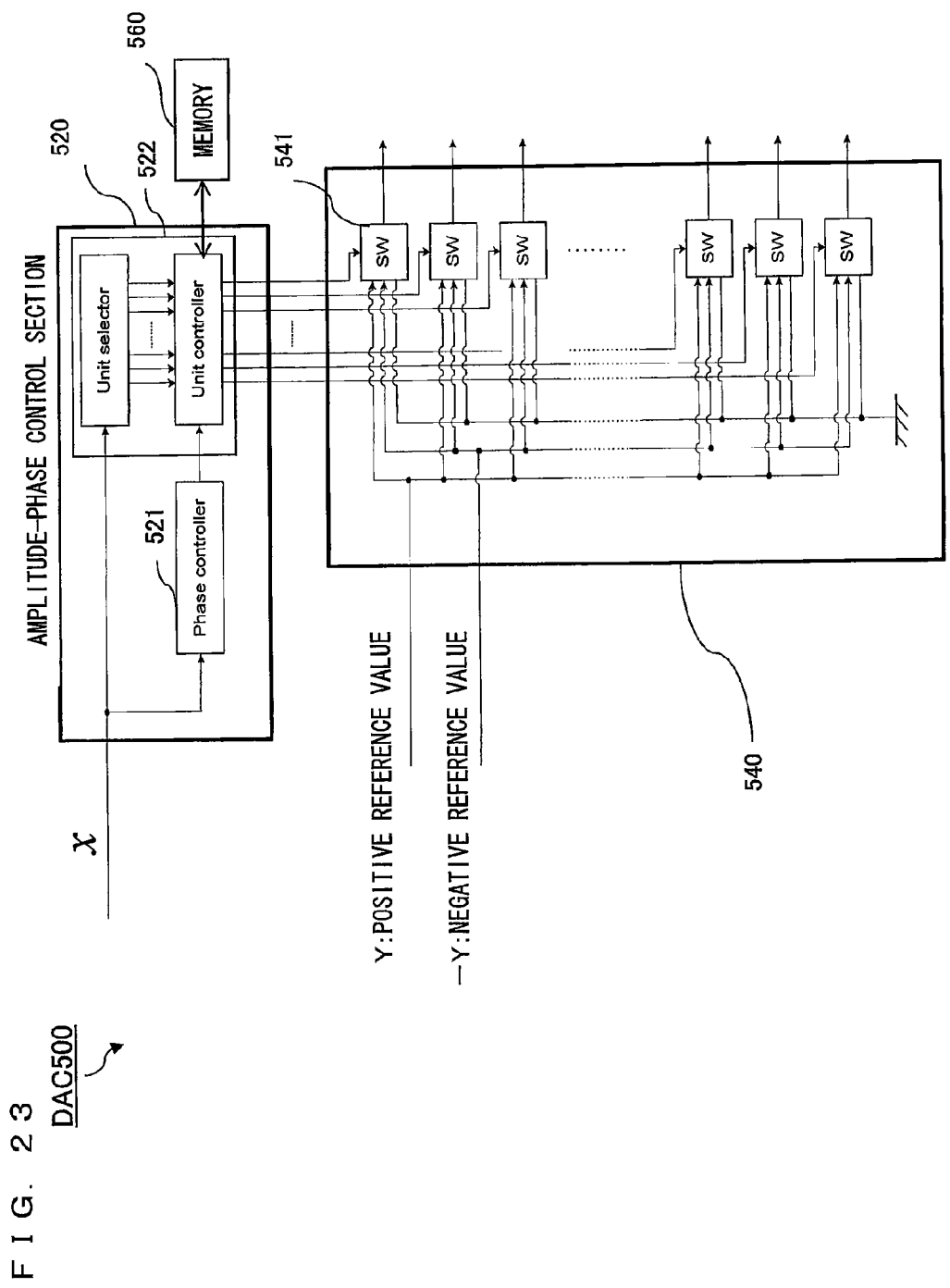
FIG. 23 is a diagram illustrating the configuration of a DAC 500 according to a third embodiment of the present invention.
Figure 24:
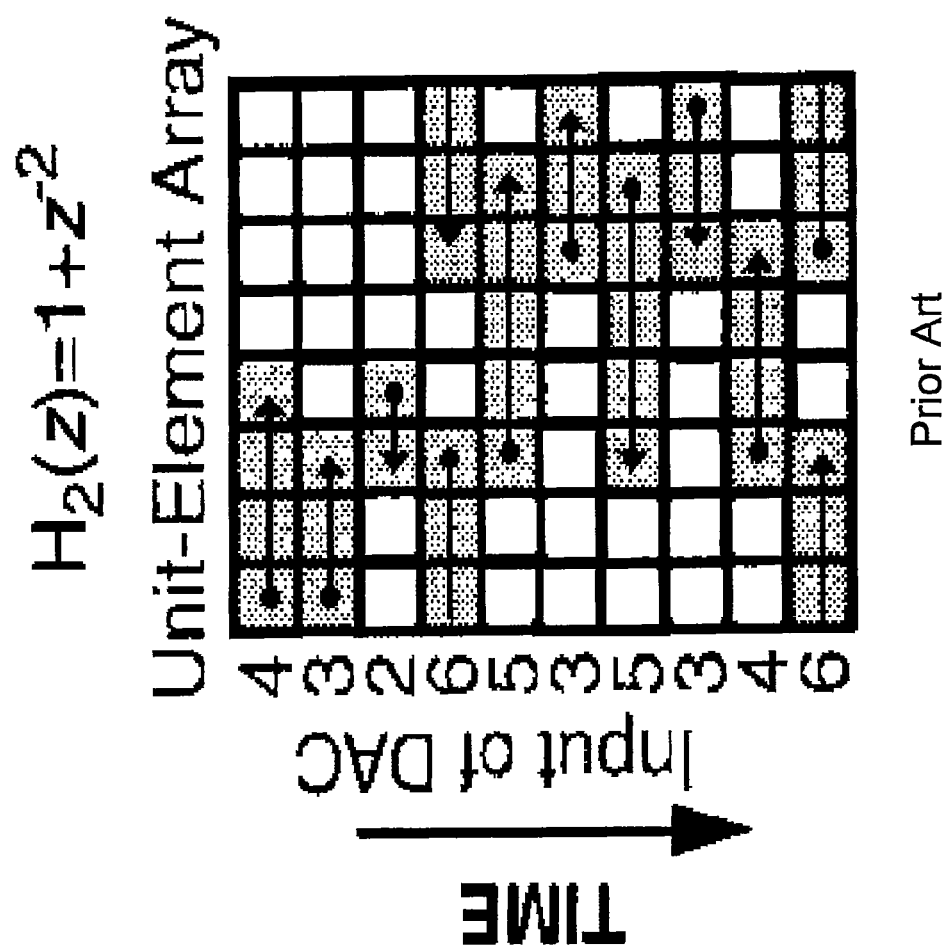
FIG. 24 is a diagram illustrating an algorithm for controlling a unit-element array on the basis of input information that is information two items before in a temporal axis.

The range in which the present invention is applied includes RF DACs as well as general DACs used for signal processing. Each RF DAC described above as the DAC of the present invention is applied to a transmitter. Here, a basic embodiment of the DAC of the present invention will be described. FIG. 23 illustrates the configuration of a DAC 500 according to the present embodiment.

The DAC 500 includes a switch bank 540 including a plurality of switches 541, a memory 560, and a switch selection section 522. In the memory 560, a history of previously selected switches 541 and a history of the values of previous input signals are stored. A rule for selection of the switches 541 is different depending on a change of an input signal from a previous input signal.

As an example, reference signals Y and −Y having positive and negative values are inputted to the switch bank 540. Each reference value may be represented by the voltage or current of an input signal. An input signal x having a negative or positive value or 0 is inputted to the amplitude-phase control section 520. The amplitude-phase control section 520 refers to the memory 560, and changes each switch 541 to any of Y, −Y, and an Off state on the basis of a change of the sign of the value of a current input signal x from the sign of a value that is a predetermined time ago. An output of each switch 541 is inputted to, for example, a combiner, and combined therein.

As an algorithm for switch selection, for example, the algorithm in the first embodiment is used, whereby a DAC can be configured which has a transfer function with a notch for reducing an error signal level in a desired frequency band.

Further, in each embodiment described above, the case where the present invention is configured as hardware has been described as an example. However, the present invention can also be realized as software in cooperation with hardware.

What is claimed is:

1. A DAC (Digital to Analog Converter) for converting a digital signal that is an input signal, into an analog signal, the DAC comprising:

a switch bank to which at least two reference signals are inputted, which includes a plurality of switches for selecting any of the reference signals, and which outputs the selected reference signal through a plurality of paths;

a memory in which a history of previously selected switches among the plurality of switches and previous sample values of the input signal are stored; and an amplitude-phase control section to which the input signal is inputted and which controls the switches of the switch bank on the basis of the input signal, wherein the amplitude-phase control section refers to the memory and controls the switches of the switch bank in accordance with the history of the previously selected switches and a change of a current sample value of the input signal from a sample value that is a predetermined time ago, in order to select any of the at least two reference signals.

2. The DAC according to claim 1, wherein as the at least two reference signals, signals representing values of different signs are inputted to the switch bank, and the amplitude-phase control section refers to the memory and controls the switches of the switch bank in accordance with the history of the previously selected switches and a sign change of a current sample value of the input signal from a sample value that is a predetermined time ago, in order to select any of the at least two reference signals.

3. The DAC according to claim 1, wherein the input signal is at least either one of an I signal or a Q signal, and as the at least two reference signals, RF signals of at least two different phases are inputted to the switch bank.

4. The DAC according to claim 3, further comprising:

an RF signal generator which generates RF signals of at least four different phases as the at least two reference signals; and a combination section which combines output signals from the switch bank, wherein the input signal is an I signal and a Q signal, the switch bank includes:

a first switch bank to which two RF signals that are a part of the RF signals of the at least four different phases that are generated by the RF signal generator are inputted, and which includes a switch for selecting either one of the two RF signals and a first switch group including a plurality of switches for outputting the selected RF signal through a plurality of paths; and a second switch bank to which two RF signals that are another part of the RF signals of the at least four different phases that are generated by the RF signal generator are inputted, and which includes a switch for selecting either one of the two RF signals and a second switch group including a plurality of switches for outputting the selected RF signal through a plurality of paths, the memory includes:

a first memory in which a history of previously selected switches among the plurality of switches of the first switch group and previous sample values of the I signal are stored; and a second memory in which a history of previously selected switches among the plurality of switches of the second switch group and previous sample values of the Q signal are stored, the amplitude-phase control section includes:

a first amplitude-phase control section which controls the switch of the first switch bank and the first switch group; and a second amplitude-phase control section which controls the switch of the second switch bank and the second switch group, the first amplitude-phase control section controls the switch of the first switch bank in accordance with a sign of a signal level of the I signal in order to select either one of the two RF signals inputted to the first switch bank, and refers to the first memory and controls each switch of the first switch group in accordance with the history of the previously selected switches of the first switch group and a sign difference of a current sample value of the I signal from a sample value that is a predetermined time ago, in order to output the selected RF signal through the plurality of paths, and the second amplitude-phase control section controls the switch of the second switch bank in accordance with a sign of a signal level of the Q signal in order to select either one of the two RF signals inputted to the second switch bank, and refers to the second memory and controls each switch of the second switch group in accordance with the history of the previously selected switches of the second switch group and a sign difference of a current sample value of the Q signal from a sample value that is a predetermined time ago, in order to output the selected RF signal through the plurality of paths.

5. The DAC according to claim 4, wherein the RF signal generator generates RF signals of phases $\theta_1=0$, $\theta_2=\pi$, $\theta_3=\pi/2$, and $\theta_4=-\pi/2$, the RF signals of the phases $\theta_1=0$ and $\theta_2=\pi$ are inputted to the first switch bank, and with regard to a value $X_n$ of the I signal at time $T_n$, the first amplitude-phase control section controls the switch of the first switch bank in order to:

select the RF signal of the phase $\theta_1$ when $X_n \geq 0$; and select the RF signal of the phase $\theta_2$ when $X_n < 0$, and the RF signals of the phases $\theta_3=\pi/2$ and $\theta_4=-\pi/2$ are inputted to the second switch bank, and with regard to a value $Y_n$ of the Q signal at time $T_n$, the second amplitude-phase control section controls the switch of the second switch bank in order to:

select the RF signal of the phase $\theta_3$ when $Y_n \geq 0$; and select the RF signal of the phase $\theta_4$ when $Y_n < 0$.

6. The DAC according to claim 4, wherein the first amplitude-phase control section controls each switch of the first switch group on the basis of a different rule in accordance with a sign difference between a value $X_n$ of the I signal at time $T_n$ and a sample $X_{n-p}$ that is a sample a predetermined value p before the $X_n$.

7. The DAC according to claim 6, wherein
when $X_n$ is not 0, the first amplitude-phase control section calculates Mathematical Formula 1 and Mathematical Formula 2, turns switches $k_{1,n}$ to $k_{2,n}$ of the first switch group ON, and turns other switches OFF, and
when $X_n$ is 0, the first amplitude-phase control section calculates Mathematical Formula 3 and turns all the switches of the of the first switch group OFF, $$\left. \begin{array}{l} \text{when } X_n \cdot X_{n-p} \geq 0 \\ k_{1,n} = k_{2,n-p} \\ d_n = -d_{n-p} \\ k_{2,n} = k_{1,n} + d_n(|X_n| - 1) \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 1)}$$

$$\left. \begin{array}{l} \text{when } X_n \cdot X_{n-p} < 0 \\ k_{1,n} = k_{2,n-p} \\ \text{where } p < q \\ d_n = -d_{n-q} \\ k_{2,n} = k_{1,n} + d_n(|X_n| - 1) \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 2)}$$

$$\left. \begin{array}{l} k_{1,n} = k_{2,n-p} \\ d_n = -d_{n-p} \\ k_{2,n} = k_{1,n} + d_n|X_n| \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 3)}$$

where
$d_n$ is a sign corresponding to a direction of an arrow from $k_{1,n}$ to $k_{2,n}$,
p is a positive integer that satisfies that n-p>0,
q is a positive integer that satisfies that p<q, and
S is the number of the switches constituting the switch group.

8. The DAC according to claim 4, wherein the second amplitude-phase control section controls the switch of the second switch bank on the basis of a different rule in accordance with a sign difference between a value $Y_n$ of the Q signal at time $T_n$ and a sample $Y_{n-p}$ that is a sample a predetermined value p before the $Y_n$.

9. The DAC according to claim 8, wherein the second amplitude-phase control section controls each switch of the second switch group such that:
when Yn is not 0, the second amplitude-phase control section calculates Mathematical Formula 4 and Mathematical Formula 5, turns switches $k_{1,n}$ to $k_{2,n}$ of the second switch group ON, and turns other switches OFF; and
when Yn is 0, the second amplitude-phase control section calculates Mathematical Formula 6 and turns all the switches of the second switch group OFF, $$\left. \begin{array}{l} \text{when } Y_n \cdot Y_{n-p} \geq 0 \\ k_{1,n} = k_{2,n-p} \\ d_n = -d_{n-p} \\ k_{2,n} = k_{1,n} + d_n(|Y_n| - 1) \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 4)}$$

$$\left. \begin{array}{l} \text{when } Y_n \cdot Y_{n-p} < 0 \\ k_{1,n} = k_{2,n-q} \\ d_n = -d_{n-q} \\ k_{2,n} = k_{1,n} + d_n(|Y_n| - 1) \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 5)}$$

$$\left. \begin{array}{l} k_{1,n} = k_{2,n-p} \\ d_n = -d_{n-p} \\ k_{2,n} = k_{1,n} + d_n|Y_n| \\ k_{2,n} = \begin{cases} k_{2,n} + S & \text{if } k_{2,n} \leq 0 \\ k_{2,n} - S & \text{if } k_{2,n} \geq S+1 \end{cases} \end{array} \right\} \quad \text{(Mathematical Formula 6)}$$

where
$d_n$ is a sign corresponding to a direction of an arrow from $k_{1,n}$ to $k_{2,n}$,
p is a positive integer that satisfies that n-p>0,
q is a positive integer that satisfies that p<q, and
S is the number of the switches constituting the switch group.

10. The DAC according to claim 3, wherein
the input signal is an I signal and a Q signal,
the DAC further comprises:
an RF signal generator which generates RF signals of a plurality of phases as the at least two reference signals;
a combination section which combines output signals from the switch bank,
the switch bank includes a switch for selecting any of the RF signals of the plurality of phases that are generated by the RF signal generator, and a switch group including a plurality of switches for outputting the selected RF signal through a plurality of paths,
the amplitude-phase control section controls the switch of the switch bank in accordance with a phase of a vector represented by the I signal and the Q signal, in order to select any of the RF signals of the plurality of phases, and
the amplitude-phase control section refers to the memory and controls each switch of the switch group in accordance with the history of the previously selected switches and a phase change of a current sample value of a signal represented by the I signal and the Q signal from a sample value that is a predetermined time ago, in order to output the selected RF signal through the plurality of paths.

11. The DAC according to claim 10, wherein the amplitude-phase control section controls each switch of the switch group on the basis of a different rule in accordance with a phase difference between a phase $\theta_n$ of the vector represented by the I signal and the Q signal at time $T_n$ and a sample $\theta_{n-p}$ that is a sample a predetermined value p before the $\theta_n$.

12. The DAC according to claim 11, wherein the phase of the vector represented by the I signal and the Q signal is any one of 0, $2\pi\cdot(1/M)$, $2\pi\cdot(2/M)$, ..., $2\pi$, the RF signal generator RF generates signals of phases $\theta1=2\pi\cdot(1/M)$, $\theta2=2\pi\cdot(2/M)$, ..., $\theta M=2\pi$ to the switch bank, the amplitude-phase control section selects an RF signal of the same phase as the phase of the vector represented by the I signal and the Q signal, when a magnitude $X_n$ of the vector represented by the I signal and the Q signal at time $T_n$ is not 0, the amplitude-phase control section turns switches $k_{1,n}$ to $k_{2,n}$ of the switch group ON and turns other switches OFF using Mathematical Formula 7, and when $X_n$ is 0, the amplitude-phase control section performs calculation using Mathematical Formula 8 and turns all the switches of the switch group OFF, $$\left.\begin{aligned}&\text{when } \theta_n = \theta_{n-p} + m\frac{2\pi}{M}(m=1,2,\ldots,M)\\&k_{1,n} = k_{1,n-pm}\\&d_n = -d_{n-pm}\\&k_{2,n} = k_{1,n} + d_n(|X_n|-1)\\&k_{2,n} = \begin{cases} k_{2,n}+S & \text{if } k_{2,n} \le 0\\ k_{2,n}-S & \text{if } k_{2,n} \ge S+1 \end{cases}\end{aligned}\right\} \quad \text{(Mathematical Formula 7)}$$

$k_{1,n}=k_{1,n-p}$ $d_n=-d_{n-p}$ $k_{2,n}=k_{1,n}+d_n|X_n|$ (Mathematical Formula 8)

where $d_n$ is a sign corresponding to a direction of an arrow from $k_{1,n}$ to $k_{2,n}$, p, p1, p2, ..., pM are positive integers less than n, and S is the number of the switches constituting the switch group.

13. The DAC according to claim 11, wherein the I signal and the Q signal are such signals that the vector represented by these signals represents a symbol on an I axis or a Q axis the RF signal generator generates RF signals of phases $\theta1=0$, $\theta2=\pi/2$, $\theta3=\pi$, and $\theta4=-\pi/2$, the amplitude-phase control section selects an RF signal of the same phase as the phase of the vector represented by the I signal and the Q signal, when a magnitude $X_n$ of the vector represented by the I signal and the Q signal at time $T_n$ is not 0, the amplitude-phase control section calculates Mathematical Formulas 9 to 12, turns switches $k_{1,n}$ to $k_{2,n}$ of the switch group ON, and turns other switches OFF, and when $X_n$ is 0, the amplitude-phase control section calculates Mathematical Formula 13 and turns all the switches of the switch group OFF, $$\left.\begin{aligned}&\text{when } \theta_n = \theta_{n-p} + \frac{\pi}{2}\\&k_{1,n} = k_{1,n-p1}\\&d_n = -d_{n-p1}\\&k_{2,n} = k_{1,n} + d_n(|X_n|-1)\\&k_{2,n} = \begin{cases} k_{2,n}+S & \text{if } k_{2,n} \le 0\\ k_{2,n}-S & \text{if } k_{2,n} \ge S+1 \end{cases}\end{aligned}\right\} \quad \text{(Mathematical Formula 9)}$$

$$\left.\begin{aligned}&\text{when } \theta_n = \theta_{n-p}\\&k_{1,n} = k_{1,n-p2}\\&d_n = -d_{n-p2}\\&k_{2,n} = k_{1,n} + d_n(|X_n|)\\&k_{2,n} = \begin{cases} k_{2,n}+S & \text{if } k_{2,n} \le 0\\ k_{2,n}-S & \text{if } k_{2,n} \ge S+1 \end{cases}\end{aligned}\right\} \quad \text{(Mathematical Formula 10)}$$

$$\left.\begin{aligned}&\text{when } \theta_n = \theta_{n-p} = \frac{\pi}{2}\\&k_{1,n} = k_{1,n-p3}\\&d_n = -d_{n-p3}\\&k_{2,n} = k_{1,n} + d_n(|X_n|)\\&k_{2,n} = \begin{cases} k_{2,n}+S & \text{if } k_{2,n} \le 0\\ k_{2,n}-S & \text{if } k_{2,n} \ge S+1 \end{cases}\end{aligned}\right\} \quad \text{(Mathematical Formula 11)}$$

$$\left.\begin{aligned}&\text{when } \theta_n = \theta_{n-p} + \pi\\&k_{1,n} = k_{1,n-p4}\\&d_n = -d_{n-p4}\\&k_{2,n} = k_{1,n} + d_n(|X_n|)\\&k_{2,n} = \begin{cases} k_{2,n}+S & \text{if } k_{2,n} \le 0\\ k_{2,n}-S & \text{if } k_{2,n} \ge S+1 \end{cases}\end{aligned}\right\} \quad \text{(Mathematical Formula 12)}$$

$k_{1,n}=k_{1,n-p}$ $d_n=-d_{n-p}$ $k_{2,n}=k_{1,n}+d_n|X_n|$ (Mathematical Formula 13)

where $d_n$ is a sign corresponding to a direction of an arrow from $k_{1,n}$ to $k_{2,n}$, p, p1, p2, p3, and p4 are positive integers less than n, and S is the number of the switches constituting the switch group.

14. The DAC according to claim 1, wherein the input signal is a first signal which includes a signal representing any of phases $-\pi/2$, 0, $\pi/2$, and $\pi$ and a signal representing a positive amplitude, and a second signal which includes a signal representing any of phases $-3\pi/4$, $-\pi/4$, $\pi/4$ and $3\pi/4$ and a signal representing a positive amplitude, the DAC further comprises:

an RF signal generator which generates RF signals of at least eight phases ($-\pi/2$, 0, $\pi/2$, $\pi$, $-3\pi/4$, $-\pi/4$, $\pi/4$, and $3\pi/4$) as the at least two reference signals; and a combination section which combines RF signals outputted from the switch bank, the switch bank includes:
a first switch bank to which the RF signals of at least four phases ($-\pi/2$, $0$, $\pi/2$, and $\pi$) that are generated by the RF signal generator are inputted, and which includes a switch for selecting any of the RF signals of the four phases and a first switch group including a plurality of switches for outputting the selected RF signal through a plurality of paths; and
a second switch bank to which the RF signals of at least four phases ($-3\pi/4$, $-\pi/4$, $\pi/4$, and $3\pi/4$) that are generated by the RF signal generator are inputted, and which includes a switch for selecting any of the RF signals of the four phases and a second switch group including a plurality of switches for outputting the selected RF signal through a plurality of paths, the memory includes:
a first memory in which a history of previously selected switches among the plurality of switches of the first switch group and previous sample values of the first signal are stored; and
a second memory in which a history of previously selected switches among the plurality of switches of the second switch group and previous sample values of the second signal are stored, the amplitude-phase control section includes:
a first amplitude-phase control section which controls the switch of the first switch bank and the first switch group; and
a second amplitude-phase control section which controls the switch of the second switch bank and the second switch group, the first amplitude-phase control section controls the switch of the first switch bank in order to select an RF signal of the same phase as a phase represented by the first signal, and refers to the first memory and controls each switch of the first switch group in accordance with the history of the previously selected switches of the first switch group and a change of a vector represented by a current sample value of the first signal from a vector represented by a sample value that is a predetermined time ago, in order to output the selected RF signal through the plurality of paths, and the second amplitude-phase control section controls the switch of the first switch bank in order to select an RF signal of the same phase as a phase represented by the second signal, and refers to the second memory and controls each switch of the second switch group in accordance with the history of the previously selected switches of the second switch group and a change of a vector represented by a current sample value of the second signal from a vector represented by a sample value that is a predetermined time ago, in order to output the selected RF signal through the plurality of paths.

15. The DAC according to claim 14, wherein the first amplitude-phase control section controls each switch of the first switch group on the basis of a different rule in accordance with a phase difference between a phase $\theta_n$ of a vector represented by the first signal at time $T_n$ and a sample $\theta_{n-p}$ that is a sample a predetermined value p before the $\theta_n$, and the second amplitude-phase control section controls each switch of the second switch group on the basis of a different rule in accordance with a phase difference between a phase $\theta'_n$ of a vector represented by the second signal at time $T_n$ and a sample $\theta'_{n-p}$ that is a sample a predetermined value p before the $\theta'_n$.

16. A radio transmitting/receiving apparatus comprising:
an antenna;
an antenna switch connected to the antenna;
a receiver connected to the antenna switch; and
a DAC according to claim 1, connected to the antenna switch.

* * * * *